US009765430B2

(12) United States Patent
Saito et al.

(10) Patent No.: US 9,765,430 B2
(45) Date of Patent: Sep. 19, 2017

(54) PLASMA PROCESSING APPARATUS AND FILM FORMATION METHOD

(71) Applicant: TOKYO ELECTRON LIMITED, Tokyo (JP)

(72) Inventors: Takehisa Saito, Miyagi (JP); Takenao Nemoto, Miyagi (JP); Koji Yamagishi, Miyagi (JP); Hiroshi Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/117,804

(22) PCT Filed: Feb. 23, 2015

(86) PCT No.: PCT/JP2015/000863
§ 371 (c)(1),
(2) Date: Aug. 10, 2016

(87) PCT Pub. No.: WO2015/136852
PCT Pub. Date: Sep. 17, 2015

(65) Prior Publication Data
US 2017/0009338 A1   Jan. 12, 2017

(30) Foreign Application Priority Data

Mar. 11, 2014 (JP) .................................. 2014-047308
Jan. 30, 2015 (JP) .................................. 2015-016383

(51) Int. Cl.
*C23C 16/34* (2006.01)
*C23C 16/511* (2006.01)
(Continued)

(52) U.S. Cl.
CPC ........ *C23C 16/345* (2013.01); *C23C 16/4412* (2013.01); *C23C 16/45523* (2013.01);
(Continued)

(58) Field of Classification Search
CPC ......... H01L 21/76802; H01L 21/76814; H01L 21/02274; H01L 21/28556;
(Continued)

(56) References Cited

U.S. PATENT DOCUMENTS

| 2012/0003842 A1* | 1/2012 | Ueda ..................... C23C 16/402 |
| | | 438/788 |
| 2015/0243521 A1* | 8/2015 | Ogawa .............. H01L 21/31116 |
| | | 438/714 |
| 2015/0255258 A1* | 9/2015 | Nozawa .............. C23C 16/4584 |
| | | 156/345.42 |

FOREIGN PATENT DOCUMENTS

| JP | 2010-87186 A | 4/2010 |
| WO | 2007/139140 A1 | 12/2007 |

OTHER PUBLICATIONS

International Search Report mailed Mar. 31, 2015 in PCT/JP2015/000863.

* cited by examiner

*Primary Examiner* — Eliseo Ramos Feliciano
*Assistant Examiner* — Joannie A Garcia
(74) *Attorney, Agent, or Firm* — Rothwell, Figg, Ernst & Manbeck, P.C.

(57) ABSTRACT

A plasma processing apparatus for alternately performing a first plasma processing step using first and second processing gases and a second plasma processing step using third and fourth processing gases. The apparatus includes: a processing container that has a dielectric window in a ceiling and removably accommodates a workpiece; an exhaust unit that evacuates the processing container; a processing gas supply unit that supplies the first, second, third, and fourth processing gases into the processing container; a first gas introduction unit including a top plate gas injection port, a dielectric window gas flow path, and a first external gas flow (Continued)

path; a second gas introduction unit including a sidewall gas injection port, a sidewall gas flow path, and a second external gas flow path; an electromagnetic wave supply unit that supplies electromagnetic waves into the plasma generating space; a bypass exhaust path; and an opening/closing valve.

11 Claims, 15 Drawing Sheets

(51) Int. Cl.
    *H01L 43/12*     (2006.01)
    *H01J 37/32*     (2006.01)
    *C23C 16/455*     (2006.01)
    *H01L 21/02*     (2006.01)
    *C23C 16/44*     (2006.01)

(52) U.S. Cl.
    CPC .. *C23C 16/45529* (2013.01); *C23C 16/45536* (2013.01); *C23C 16/45548* (2013.01); *C23C 16/45561* (2013.01); *C23C 16/511* (2013.01); *H01J 37/3244* (2013.01); *H01J 37/32119* (2013.01); *H01J 37/32192* (2013.01); *H01J 37/32238* (2013.01); *H01J 37/32449* (2013.01); *H01L 21/0217* (2013.01); *H01L 21/02274* (2013.01); *H01L 43/12* (2013.01); *H01J 2237/3321* (2013.01)

(58) Field of Classification Search
    CPC ......... H01L 21/32136; H01L 21/32137; H01L 21/67207; H01L 29/51; H01L 43/12
    See application file for complete search history.

|  | H₂=35 sccm | H₂=70 sccm | H₂=87 sccm |
|---|---|---|---|
| Tt | 20.0 nm | 19.7 nm | 17.1 nm |
| Ts(Coverage) | 16.7 nm (83%) | 17.4 nm (88%) | 15.5 nm (91%) |

PLASMA PROCESSING APPARATUS AND FILM FORMATION METHOD

CROSS REFERENCE TO RELATED APPLICATION

This application is a 35 U.S.C. 371 National Phase Entry Application from PCT/JP2015/000863, filed Feb. 23, 2015, which claims priority to Japanese Patent Application Nos. 2014-047308, filed Mar. 11, 2014 and 2015-016383, filed Jan. 30, 2015, the disclosures of which are incorporated herein in their entirety by reference.

TECHNICAL FIELD

The present disclosure relates to a plasma processing apparatus using an electromagnetic wave discharge for plasma generation, and a film formation method for forming an insulating film on a workpiece.

BACKGROUND

In a manufacturing process of a semiconductor device or a flat panel display (FPD), plasma is often used in a processing (e.g., etching, deposition, oxidation, or sputtering) in order to perform a reaction satisfactorily at a relatively low temperature. Conventionally, in such a plasma process, plasma generated by a high frequency discharge in a MHz region, or plasma generated by a microwave discharge in a GHz region, has been widely used.

The plasma generated by a microwave discharge has an advantage of being able to generate high-density plasma having a low electron temperature at a low pressure. Particularly, since a planar microwave introduction window structure incorporating a slot antenna is adopted, large-diameter plasma may be efficiently generated. Further, since no magnetic field is required, the microwave discharge has an advantage of simplifying a plasma processing apparatus.

Even in a microwave plasma processing apparatus, in order to generate plasma required for a desired process, it is necessary to supply a predetermined processing gas into a vacuum chamber (processing chamber) in order to discharge the processing gas in the chamber. In general, a dielectric window for microwave introduction is attached to the ceiling of the chamber as a top plate. In a plasma generating space within the chamber, an electric field and a radiation power of the microwaves are the strongest in the vicinity of the inside of the dielectric window (top plate). Thus, the highest plasma generation efficiency is obtained by introducing a processing gas to the vicinity thereof. Therefore, a gas introduction mechanism is commonly used to introduce a processing gas from the ceiling into the chamber through a gas flow path penetrating the dielectric window.

Indeed, the dielectric window also serves as a propagation path of the microwaves, and a microwave electric field is widely distributed therein. Thus, when the processing gas is exposed to the microwave field in the gas flow path of the dielectric window, the processing gas may be discharged. When the processing gas is discharged in the gas flow path of the dielectric window, the microwave power may be unnecessarily consumed, and the conductance may be reduced due to the deposition of decomposed products of the processing gas onto the wall of the gas flow path. In the worst case, the dielectric window may be damaged by the discharge.

As a technique for suppressing such an abnormal discharge inside the dielectric window, there is a conventional technique in which a wall of gas flow path or a gas injecting unit is made of a conductor to electromagnetically shield a processing gas flowing through the gas flow path inside the dielectric window, from the microwave electric field. However, in this technique, the gas injecting unit of the conductor (metal) facing the plasma generating space may be sputtered by the attack of ions from the plasma, resulting in contamination. In addition, when the microwave electric field is electromagnetically shielded, a uniform plasma processing may be hindered. Therefore, a method of controlling the pressure in the gas injecting unit in a high region significantly deviating from a Paschen discharge region, without using a metal injector in the gas injecting unit of the dielectric window, has been suitably used.

Meanwhile, a silicon nitride (SiN) film has been conventionally widely used to protect the surface or the side of a device element on the workpiece such as, for example, a semiconductor wafer. A plasma CVD method by a microwave discharge has been known as a film formation method of the SiN film. For example, Patent Document 1 discloses a film formation method in which microwaves are introduced into a processing container by a flat antenna having a plurality of holes to generate plasma, and a SiN film is formed on a workpiece in accordance with a plasma CVD method. In the film formation method, trisilylamine (TSA) is exemplified as a part of raw materials used for the formation of the SiN film. Further, Patent Document 2 discloses a technique of forming a SiN film on a workpiece in accordance with a plasma DVD method, using silane ($SiH_4$) for a film formation raw gas.

PRIOR ART DOCUMENT

Patent Document

Patent Document 1: Japanese Patent Laid-Open Publication No. 2010-087186
Patent Document 2: International Publication No. 2007/139140

DISCLOSURE OF THE INVENTION

Problems to be Solved

Recently, in a semiconductor manufacturing process of a next generation device such as, for example, a magnetoresistive random access memory (MRAM), very high coverage and electrical insulation are required for the SiN film covering the side or the surface of the device element formed in a very small dimension on the workpiece. Patent Documents 1 and 2 do not disclose a film formation method of the SiN film which realizes a high coverage and a high resistance with a low-temperature process. Thus, a film formation method satisfying these requirements has been demanded.

To solve the problem, the present inventors have already conceived a film formation method capable of forming a SiN-containing insulating film having a high coverage characteristic and a high electrical insulation characteristic by repeating, a plurality of times, a film formation step of forming an insulating film containing SiN on a substrate by ionizing or dissociating a processing gas, which is obtained by adding $H_2/N_2$ to TSA, in a processing container by a microwave discharge, and after the film formation step, a nitriding step of nitriding the insulating layer by ionizing or dissociating the processing gas containing $N_2$. In addition, while the new film formation method is put to practical use, it is found that the electrical insulation characteristic of the SiN-containing insulating film is enhanced by increasing the number of times of repeating the film formation step and the nitriding step (the number of cycles) to obtain the same film thickness.

However, in the microwave discharge type plasma processing apparatus, when a method of controlling the pressure in the gas flow path in a high region significantly deviating from a Paschen discharge region is adopted for prevention of the abnormal discharge as described above, it takes a long time to change the gas in the dielectric window gas flow path into a gas at a high pressure level when switching between the film formation step and the nitriding step. Thus, a new problem arises in that it is difficult to increase the number of cycles in the film formation method of the SiN-containing insulating film.

The present disclosure has been made in consideration of the problems in the related art, and provides a plasma processing apparatus that realizes high speed of the process alternately repeating different kinds of plasma processing steps in a constant cycle by changing the gas in the dielectric window gas flow path in a short time while suppressing the abnormal discharge in the dielectric window gas flow path in a case where the processing gas and the electromagnetic waves for plasma generation are introduced into the processing container through the dielectric window.

In addition, the present disclosure provides a film formation method capable of forming a SiN-containing insulating film having excellent coverage and electrical insulation characteristics on the workpiece using the plasma processing apparatus of the present disclosure.

Means to Solve the Problems

The present disclosure provides a plasma processing apparatus for alternately repeatedly performing a first plasma processing step using first and second processing gases and a second plasma processing step using third and fourth processing gases. The plasma processing apparatus includes a processing container provided with a dielectric window in a ceiling and configured to removably accommodate a workpiece; an exhaust unit configured to evacuate the processing container; a processing gas supply unit configured to supply the first, second, third, and fourth processing gases into the processing container; a first gas introduction unit that includes a top plate gas injection port provided in the dielectric window to face a plasma generating space in the processing container, a dielectric window gas flow path that penetrates through the dielectric window from an outside and arrives at the top plate gas injection port, and a first external gas flow path that defines a gas flow path from the processing gas supply unit to the dielectric window gas flow path; a second gas introduction unit that includes a sidewall gas injection port provided in a sidewall of the processing container to face the plasma generating space in the processing container, a sidewall gas flow path that extends circumferentially inside the sidewall of the processing container and communicates with the sidewall gas injection port, and a second external gas flow path that defines a gas flow path from the processing gas supply unit to the sidewall gas flow path; an electromagnetic wave supply unit configured to supply electromagnetic waves for plasma generation into the plasma generating space in the processing container through the dielectric window; a bypass exhaust path connecting the first external gas flow path and the exhaust unit; and an opening/closing valve provided in the bypass exhaust path. In the first plasma processing step, the first and second processing gases are introduced from the processing gas supply unit into the processing container through the first and second gas introduction units, respectively, and the electromagnetic waves for plasma generation are introduced from the electromagnetic wave supply unit into the processing container. In the second plasma processing step, the third and fourth processing gases are introduced into the processing container through the first and second gas introduction units, respectively, by the processing gas supply unit, and the electromagnetic waves for plasma generation are introduced from the electromagnetic wave supply unit into the processing container. After the first or second plasma processing step is completed, the opening/closing valve is opened to discharge a gas remaining in the dielectric window gas flow path of the first gas introduction unit to the exhaust unit side via the bypass exhaust path.

According to the plasma processing apparatus of the present disclosure, in a configuration in which the processing gas and the electromagnetic waves for plasma generation are introduced into the processing container through the dielectric window, a dielectric gas flow path provided in the dielectric window is connected to the exhaust unit at the upstream side thereof through the bypass exhaust path outside the processing container, and the opening/closing valve is provided in the bypass exhaust path. And, when the first plasma processing step and the second plasma processing step are alternately repeated, after the first or second plasma processing step is completed, the opening/closing valve is opened to discharge the gas remaining in the dielectric window gas flow path to the exhaust unit side via the bypass exhaust path. Thus, the gas in the dielectric window gas flow path may be changed at a high speed.

The present disclosure provides a method for forming an insulating film on a workpiece using a plasma processing apparatus including: a processing container provided with a dielectric window in a ceiling and configured to removably accommodate the workpiece; an exhaust unit configured to evacuate the processing container; a processing gas supply unit configured to supply first, second, third, and fourth processing gases into the processing container; a first gas introduction unit that includes a top plate gas injection port provided in the dielectric window to face a plasma generating space in the processing container, a dielectric window gas flow path that penetrates through the dielectric window from an outside and arrives at the top plate gas injection port, and a first external gas flow path that defines a gas flow path from the processing gas supply unit to the dielectric window gas flow path; a second gas introduction unit that includes a sidewall gas injection port provided in a sidewall of the processing container to face the plasma generating space in the processing container, a sidewall gas flow path that extends circumferentially inside the sidewall of the processing container and communicates with the sidewall gas injection port, and a second external gas flow path that defines a gas flow path from the processing gas supply unit to the sidewall gas flow path; an electromagnetic wave supply unit configured to supply electromagnetic waves for plasma generation into the plasma generating space in the processing container through the dielectric window; a bypass exhaust path connecting the first external gas flow path and the exhaust unit; and an opening/closing valve provided in the bypass exhaust path. The method includes: a first step of forming a SiN-containing insulating film containing SiN on the workpiece under plasma of the first and second processing gases generated in the processing container by decompressing the processing container by the exhaust unit while introducing the first and second processing gases each containing trisilylamine (TSA), $N_2$ gas, Ar gas, and $H_2$ gas from the processing gas supply unit into the processing container through the first and second gas introduction unit, respectively, and introducing the electromagnetic waves for plasma generation from the electromagnetic wave supply unit; a second step of nitriding the SiN-containing insulating film on the workpiece under plasma of the third and fourth processing gases generated in the processing container by decompressing the processing container by the exhaust unit while introducing the first and second processing gases each containing $N_2$ gas, Ar gas, and $H_2$ gas from the processing gas supply unit into the processing container through the first and second gas introduction unit, respectively, and introducing the electromagnetic waves for plasma generation from the electromagnetic wave supply unit; and a third step of discharging a gas remaining in the dielectric window gas flow path of the first gas introduction unit to the exhaust unit side via the bypass exhaust path by opening the opening/closing valve after the first or second plasma processing step is completed. The first step and the second step are alternately repeated.

The film formation method of the present disclosure may form a SiN-containing insulating film having excellent coverage and electrical insulation characteristics on the workpiece by alternately performing the first step (plasma film formation) and the second step (plasma nitriding) with the third step (purging) performed therebetween, using the plasma processing apparatus of the present disclosure.

Effect of the Invention

According to the plasma processing apparatus of the present disclosure, the high speed of the process alternately repeating different kinds of plasma processing steps in a constant cycle may be realized by changing the gas in the dielectric window gas flow path in a short time while suppressing the abnormal discharge in the dielectric window gas flow path in a case where the processing gas and the electromagnetic waves for plasma generation are introduced into the processing container through the dielectric window.

According to the film formation method of the present disclosure, a SiN-containing insulating film having excellent coverage and electrical insulation characteristics may be formed on the workpiece by the configuration and operation as described above.

DETAILED DESCRIPTION TO EXECUTE THE INVENTION

Hereinafter, proper exemplary embodiments of the present disclosure will be described with reference to accompanying drawings.

[Configuration of Entire Plasma Processing Apparatus]

Figure 1:
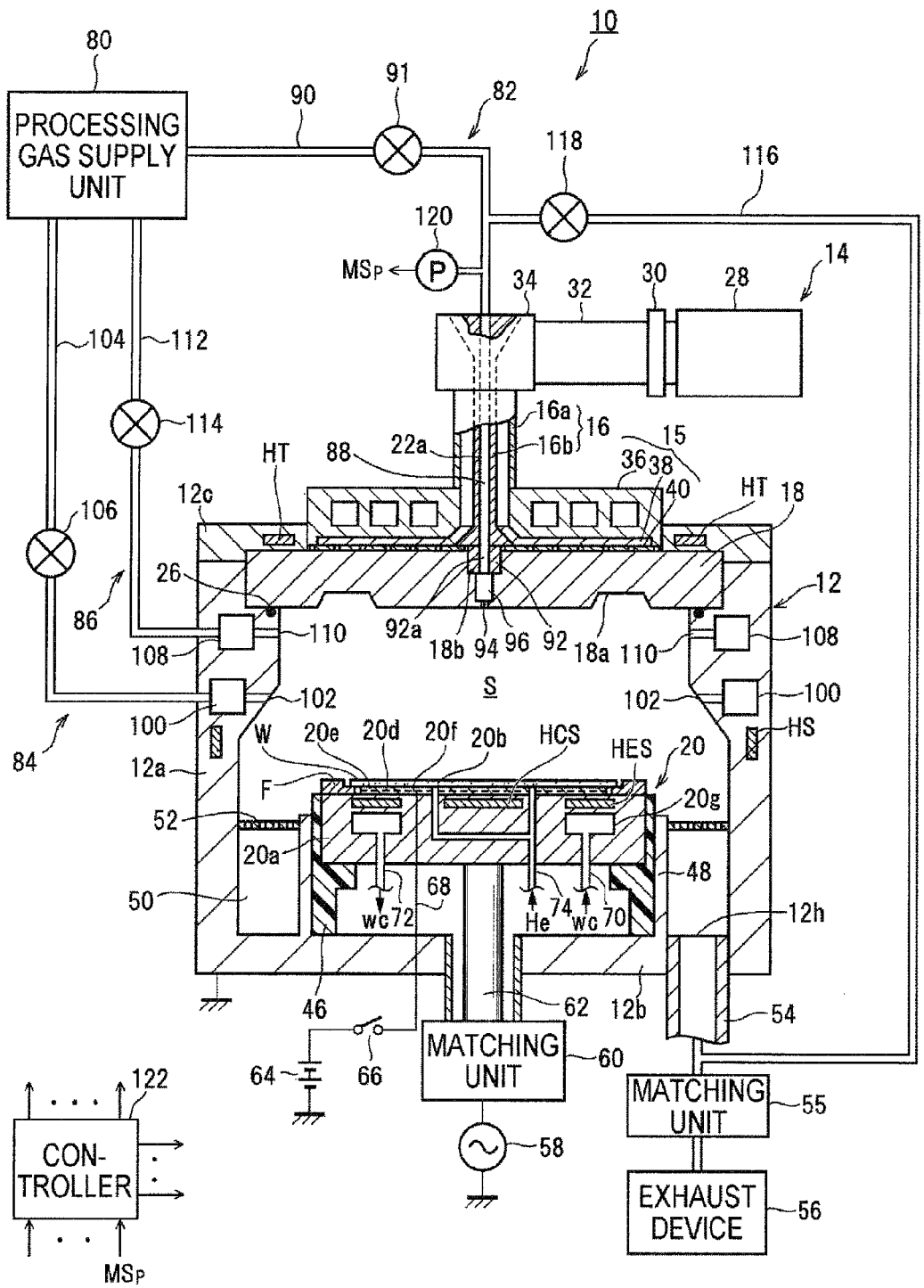
FIG. 1 is a cross-sectional view illustrating a configuration of a plasma processing apparatus according to an exemplary embodiment of the present exemplary embodiment.

FIG. 1 illustrates a configuration of a plasma processing apparatus according to an exemplary embodiment of the present exemplary embodiment. The plasma processing apparatus 10 is an apparatus for performing a plasma processing such as, for example, plasma CVD, plasma ALD, or plasma etching under surface wave plasma that is excited using microwaves and a flat plate slot antenna, and includes a cylindrical vacuum chamber (processing container) 12 made of a metal such as, for example, aluminum or stainless steel. The chamber 12 is grounded.

The chamber 12 accommodates a workpiece (e.g., semiconductor wafer) W, and defines a space S where plasma is generated. The chamber 12 includes a sidewall 12a, a bottom 12b, and a ceiling 12c. The sidewall 12a is formed in a substantially cylindrical shape. The bottom 12b is provided at a lower end side of the sidewall 12a. The bottom 12b is provided with an exhaust hole 12h for exhaust. The upper end portion of the sidewall 12a is opened. The upper end opening of the sidewall 12a is closed by a dielectric window 18. The dielectric window 18 is interposed between the upper end portion of the sidewall 12a and the ceiling 12c. A sealing member 26 may be interposed between the dielectric window 18 and the upper end portion of the sidewall 12a. The sealing member 26 is, for example, an O-ring, and contributes to sealing of the chamber 12.

The plasma processing apparatus includes a stage 20 on which the workpiece W is placed in the chamber 12. The stage 20 is provided below the dielectric window 18. In a configuration example, the stage 20 includes a susceptor (placing table) 20a and an electrostatic chuck 20b.

The susceptor 20a is supported by a cylindrical support 46. The cylindrical support 46 is made of an insulating material, and extends vertically upwardly from the bottom 12b. Further, a cylindrical conductive support 48 is provided on the outer periphery of the cylindrical support 46. The cylindrical support 48 extends vertically upwardly from the bottom 12b of the chamber 12 along the outer periphery of the cylindrical support 46. An annular exhaust path 50 is formed between the cylindrical support 48 and the sidewall 12a.

An annular baffle plate 52 formed with a plurality of through-holes is attached to the upper portion of the exhaust path 50. The exhaust path 50 is connected to an exhaust pipe 54 that provides one or a plurality of exhaust holes 12h. The exhaust pipe 54 is connected with a pressure adjustor (e.g., APC valve) 55 and an exhaust device 56. The exhaust device 56 includes a vacuum pump such as, for example, a turbo molecular pump. The pressure adjustor 55 adjusts an exhaust amount of the exhaust device 56 to adjust the pressure in the chamber 12. The plasma generating space S in the chamber 12 may be decompressed to a desired vacuum degree by the pressure adjustor 55 and the exhaust device 56. Further, the exhaust device 56 may be operated such that a gas is exhausted from the periphery of the stage 20 to the exhaust device 56 through an exhaust path 50.

The susceptor 20a is made of a conductor such as, for example, aluminum, and also serves as a high frequency electrode. The susceptor 20a is electrically connected with a high frequency power source 58 for RF bias via a matching unit 60 and a power feeding rod 62. The high frequency power source 58 outputs high frequency waves of a constant frequency suitable for controlling the energy of the ions incident on the workpiece W, for example, 13.65 MHz at a predetermined power. The matching unit 60 accommodates a matcher for matching between the impedance of the high-frequency power source 58 side and the impedance of the load side including, mainly, the plasma and the high frequency electrode (the susceptor 20a) in the processing container 12.

The electrostatic chuck 20b is provided on the top surface of the susceptor 20a. In a configuration example, the top surface of the electrostatic chuck 20b constitutes a placing region for placing the workpiece W. The electrostatic chuck 20b holds the workpiece W by an electrostatic attraction force. A focus ring F is provided diametrically outside the electrostatic chuck 20b to annularly surround the periphery of the workpiece W. The electrostatic chuck 20b includes an electrode 20d, an insulating film 20e, and an insulating film 20f. The electrode 20d is formed of a conductive film, and provided between the insulating film 20e and the insulating film 20f. The electrode 20d is electrically connected with a high-voltage DC power source 64 via a switch 66 and a coated wire 68. The electrostatic chuck 20b may attract and hold the workpiece W by an electrostatic force generated by the DC voltage applied from the DC power source 64.

A circumferentially extending annular coolant chamber 20g is provided inside the susceptor 20a. In the coolant chamber 20g, a coolant of a predetermined temperature (e.g., cooling water cw) is circularly supplied from a chiller unit (not illustrated) through pipes 70, 72. The processing temperature of the workpiece W on the electrostatic chuck 20b may be controlled by the temperature of the coolant wc. Further, a heat transfer gas (e.g., He gas) from a heat transfer gas supply unit (not illustrated) is supplied between the top surface of the electrostatic chuck 20b and the rear surface of the workpiece W through a gas supply pipe 74.

In a configuration example, the plasma processing apparatus 10 may further include heaters HT, HS, HCS, and HES as temperature controlling mechanisms. The heater HT is provided in the ceiling 12c, and extends annularly to surround an antenna 15. The heater HS is provided inside the sidewall 12a at a height position between the dielectric window 18 and the stage 20, and extends annularly. The heater HCS is provided inside the susceptor 20a, and faces the central portion of the workpiece W. The heater HES is provided annularly inside the susceptor 20a to surround the heater HCS, and faces the peripheral portion of the workpiece W.

The plasma processing apparatus 10 includes a microwave supply unit 14 configured to supply microwaves for plasma generation via the dielectric window 18 in the chamber 12. The microwave supply unit 14 includes the antenna 15, a coaxial waveguide 16, a microwave generator 28, a tuner 30, a waveguide 32, and a mode converter 34.

The microwave generator 28 outputs microwaves having a frequency of, for example, 2.45 GHz at a set power. The microwave generator 28 is connected to the upper portion of the coaxial waveguide 16 via the tuner 30, the waveguide 32, and the mode converter 34. The coaxial waveguide 16 includes cylindrical or tubular outer conductor 16a and inner conductor 16b which extend coaxially along the central axis of the chamber 12. The lower end of the outer conductor 16a is electrically connected to the upper portion of the cooling jacket 36 having a conductive surface. The inner conductor 16b is provided inside the outer conductor 16a. The lower end of the inner conductor 16b is connected to a slot plate 40 of the antenna 15 through a connector 15.

In a configuration example, the antenna 15 is disposed in an opening formed in the ceiling 12c. The antenna 15 includes a dielectric plate 38, and a slot plate 40. The dielectric plate 38 shortens the wavelength of the microwaves, and has a substantially disc shape. The dielectric plate 38 is made of for example, quartz or alumina. The dielectric plate 38 is interposed between the slot plate 40 and the lower side surface of the cooling jacket 36. The antenna 15 is constituted by the dielectric plate 38, the slot plate 40, and the lower side surface of the cooling jacket 36.

Figure 2:
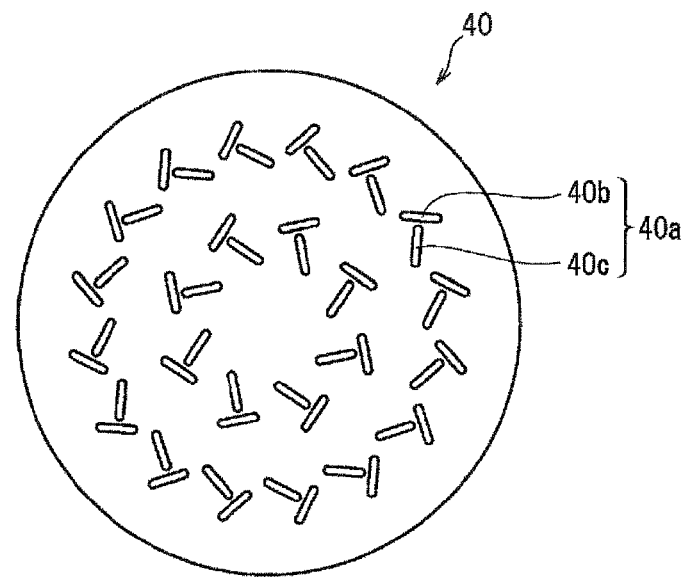
FIG. 2 is a plan view illustrating an exemplary slot plate constituting an antenna in the plasma processing apparatus.

The slot plate 40 is a substantially disc-shaped metal plate including a plurality of slot pairs formed therein. In a configuration example, the antenna 15 is, for example, a radial line slot antenna. As illustrated in FIG. 2, the slot plate 40 includes a plurality of slot pairs 40a formed therein. The plurality of slot pairs 40a is provided diametrically at a predetermined interval, as well as circumferentially at a predetermined interval. Each slot pair 40a includes two slot holes 40b and 40c. The slot hole 40b and the slot hole 40c extend in a direction intersecting with or orthogonal to each other.

Referring back to FIG. 1, the microwaves output from the microwave generator 28 are propagated through the waveguide 32, the mode converter 34, and the coaxial waveguide 16 and fed to the antenna 15. Then, the microwaves, which are widened radially while shortening the wavelength in the dielectric window 38, are radiated as circularly polarized plane waves including two orthogonal components from each slot pair 40a of the slot plate 40 toward the inside of the chamber 12. A gas near the surface of the dielectric window 18 is ionized by the electric field (microwave electric field) of surface waves propagated radially along the surface of the dielectric window 18 to generate plasma having a low electron temperature at high density.

In a configuration example, a tapered groove or recess 18a is formed annularly on the lower surface of the dielectric window 18 such that the groove width thereof gradually decreases toward the top. The recess 18a is provided to facilitate generation of standing waves by the microwaves introduced into the chamber 12, and may contribute to efficient generation of the plasma by the microwave discharge.

The plasma processing apparatus includes a processing gas supply unit 80 that provides all processing gases used in the plasma process performed in the apparatus, and also includes, as gas introduction mechanisms for introducing the processing gases provided from the processing gas supply unit, three systems of gas lines, that is, a ceiling gas line (first gas introduction unit) 82 including a gas flow path and a gas injection port provided in the dielectric window 18, and a lower sidewall gas line (second gas introduction unit) 84 and an upper sidewall gas line (third gas introduction unit) 86 each including a gas flow path and a gas injection port provided in the sidewall 12a of the chamber 12 at a different height position.

The ceiling gas line 82 includes a hollow gas flow path 88 provided inside the inner conductor 16b of the coaxial waveguide 16 to penetrate therethrough in an axis direction. A first gas supply pipe 90 from the processing gas supply unit 80 is connected to the upper end of the inner conductor 16b, so that the first gas supply pipe 90 is in communication with the gas flow path 88 of the coaxial waveguide 16. An electromagnetic valve (opening/closing valve) 91 is provided in the first gas supply pipe 90.

The connector 92 is connected to the lower end of the inner conductor 16b. The connector 92 is made of a conductor, for example, copper, aluminum, stainless, or an alloy thereof, and is accommodated in a cylindrical recess 18b formed on the upper surface of the dielectric window 18. The central portion of the connector 92 is formed with a through-hole or a gas flow path 92a in communication with the gas flow path 88 of the coaxial waveguide 16.

The central portion of the lower surface of the dielectric window 18 is formed with one or a plurality of ceiling gas injection ports 94 facing the plasma generating space S in the chamber 12. Further, the central portion of the dielectric window 18 is formed with a gas flow path extending from the bottom surface of the recess 18b on the upper surface thereof, that is, the lower end of the gas flow path 92a of the connector 92 to the ceiling gas injection port 94 (i.e., a dielectric window gas flow path 96). The dielectric window gas flow path 96 and the ceiling gas injection port 94 constitute an injector.

In the illustrated configuration example, the diameter of the ceiling gas injection port 94 is selected to have a very small size, for example, 0.1 mm or less so as not to allow ions or radicals from the microwaves introduced into the chamber 12 or the plasma generated in the chamber 12 to flow backward into the ceiling gas injection port 94. Meanwhile, the diameter of the dielectric window gas flow path 96 is selected to have a relatively large size, for example, 8 mm in order to make the dielectric window gas flow path 96 function as a gas chamber or buffer chamber. The injector constituted with the ceiling gas injection port 94 and the dielectric window gas flow path 96 is made of a dielectric. Thus, even though the injector is exposed to the plasma within the chamber 12, no contamination is caused.

Further, when the microwaves for plasma generation are supplied from the microwave supply unit 14 into the chamber 12, the pressure in the dielectric window gas flow path 96 is controlled to one-digit or two-digit higher value than the pressure in the chamber 12, that is, in a region significantly deviating from a Paschen discharge region (e.g., 40 Torr to 150 Torr). Thus, discharge of the gas (abnormal discharge) hardly occurs in the dielectric window gas flow path 96.

The processing gas sent from the processing gas supply unit 80 to the ceiling gas line 82 sequentially flows through the first gas supply pipe 90, the gas flow path 88 of the coaxial waveguide 16, the gas flow path 92a of the connector 92, and the dielectric gas flow path 96, and is injected downward from the ceiling gas injection port 94 at the terminal end toward the central portion of the stage 20.

The lower sidewall gas line 84 includes a lower buffer chamber (manifold) 100 formed annularly inside the sidewall 12a of the chamber 12 at a height position in the middle of the dielectric window 18 and the stage 20, a plurality of (e.g., twenty four (24)) lower sidewall gas injection ports 102 facing the plasma generating space S circumferentially equidistantly from the buffer chamber 100, and a second gas supply pipe 104 extending from the processing gas supply unit 80 to the lower buffer chamber 100. An electromagnetic valve (opening/closing valve) 106 is provided in the second gas supply pipe 104.

The processing gas sent from the processing gas supply unit 80 to the lower sidewall gas line 84 sequentially flows through the second gas supply pipe 104 and the lower buffer chamber 100 inside the sidewall 12a, and is injected substantially horizontally, or obliquely downwardly from the lower sidewall gas injection ports 102 at the terminal end toward the peripheral portion of the stage 20.

The upper sidewall gas line 86 includes an upper buffer chamber (manifold) 108 formed annularly inside the sidewall 12a of the chamber 12 at a height position close to the dielectric window 18, a plurality of (e.g., thirty six (36)) upper sidewall gas injection ports 110 facing the plasma generating space S circumferentially equidistantly from the buffer chamber 108, and a third gas supply pipe 112 extending from the processing gas supply unit 80 to the lower buffer chamber 108. An opening/closing valve 114 is provided in the third gas supply pipe 112.

The processing gas sent from the processing gas supply unit 80 to the upper sidewall gas line 86 sequentially flows through the third gas supply pipe 112 and the upper buffer chamber 108 inside the sidewall 12a, and is injected substantially horizontally from the upper sidewall gas injection ports 110 at the terminal end along the lower surface of the dielectric window 18.

Figure 3:
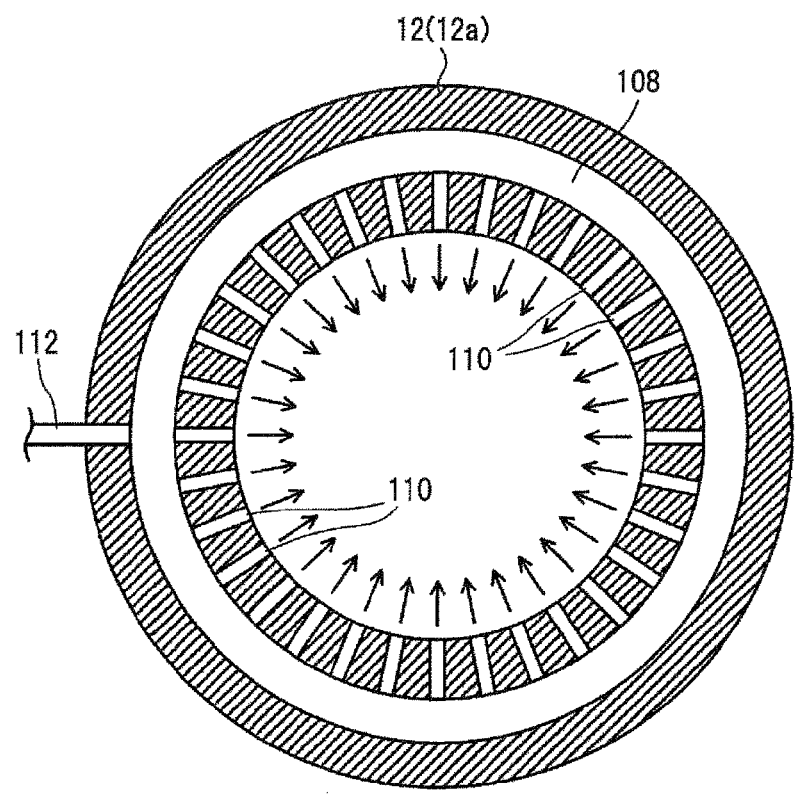
FIG. 3 is a cross-sectional view illustrating a configuration of an upper sidewall gas introduction unit in the plasma processing apparatus.

FIG. 3 illustrates a configuration of a main portion of the controller 86. As illustrated, the processing gas is injected reverse radially from the plurality of upper sidewall gas injection ports 110 distributed circumferentially at a regular interval toward the central portion of the plasma generating space S at a uniform flow rate.

The plasma processing apparatus has a configuration including the gas introduction mechanisms as described above, particularly, the ceiling gas line 82, and also includes a bypass exhaust line 116 that connects the first gas supply pipe 90 of the ceiling gas line 82 and the exhaust units 55, 56. In the illustrated configuration example, the outlet (lower end) of the bypass exhaust line 116 is connected to the exhaust path 50 between the exhaust hole 12h of the chamber 12 and the pressure adjustor 55. However, the outlet of the bypass exhaust line 116 may be connected to the exhaust path between the pressure adjustor 55 and the exhaust device 56. A normal close type electromagnetic valve (opening/closing valve) 118 is provided in the bypass exhaust line 116. Further, a pressure sensor 120 is also provided in the ceiling gas line 82 to measure the pressure at the downstream side of the electromagnetic valve 91, for example, the pressure in the first gas supply pipe 90.

A controller 122 includes a microcomputer, and controls individual operations of respective units in the plasma processing apparatus, for example, the pressure adjustor 55, the exhaust device 56, the high frequency power source 58, the matching unit 60, the switch 66 for the electrostatic chuck 20b, the microwave generator 28, the processing gas supply unit 80, the electromagnetic valves 91, 106, 114 of the gas introduction units 82, 84, 86, the electromagnetic valve 118 of the bypass exhaust path 116, the heaters HT to HES, the heat transfer gas supply unit, and the chiller unit, and the operations of the entire apparatus. Further, the controller 122 is connected to a touch panel for man-machine interface (not illustrated) and a storage device (not illustrated) that stores data including, for example, various programs or set values defining various operations of the plasma processing apparatus, and is configured to receive output signals from various sensors, especially an output signal (pressure measurement value signal) $MS_p$ from the pressure sensor 120.

Exemplary Embodiment of SiN Film Formation Process

Figure 4A:
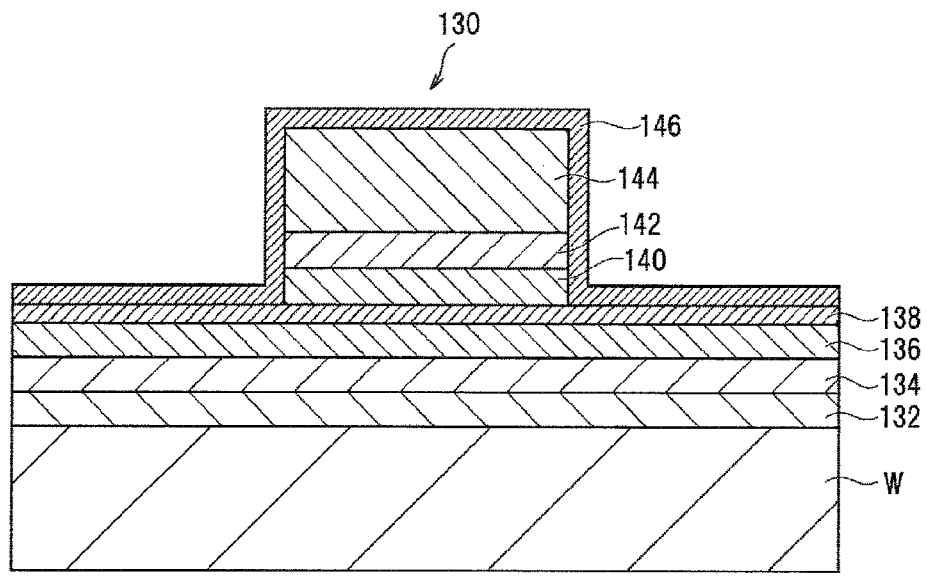
FIG. 4A is a vertical-sectional view schematically illustrating an MRAM device covered with a SiN-containing insulating film in a manufacturing process of the MRAM device.

The plasma processing apparatus of the configuration (FIG. 1) may be suitably used, for example, for a process of coating the entire surface of the semiconductor wafer W on which an MRAM element 130 is formed as illustrated in FIG. 4A, with an insulating film containing SiN (hereinafter, referred to as a "SiN-containing insulating film" or a "SiN-containing insulating layer") 146 (hereinafter, referred to as a "SiN film formation process) in a manufacturing process of MRAM.

In an MRAM device, each MRAM element 130 has a vertical type multi-layer structure having a large step, and the distance with the next MRAM element (not illustrated) is very small. Thus, the SiN film formation process is required to have a coverage characteristic and an electrical insulation characteristic at very high levels.

In the MRAM element 130 illustrated in FIG. 4A, a lower electrode layer 132, a pinning layer 134, a second magnetic layer 136, a tunnel barrier layer 138, a first magnetic layer 140, an upper electrode layer 142, and an etching mask 144 are laminated in this order from the bottom. In the SiN film formation process, the SiN-containing insulating film 146 is formed on the upper surface of the etching mask 144, on the side of the etching mask 144, the upper electrode layer 142, and the first magnetic layer 140, and on the top surface of a portion of the tunnel barrier layer 138 that extends outside the first magnetic layer 140, in a substantially uniform film thickness.

After the SiN film formation process, a portion of the SiN insulating film 146 (a transversely extending portion) is removed by etchback such that only the SiN insulating film 146 forming the sidewall of the etching mask 144, the upper electrode layer 142, and the first magnetic layer 140 remains. Further, the tunnel barrier layer 138, the second magnetic layer 136, the pinning layer 134, and the lower electrode layer 132, which extend around the SiN insulating layer 146 on the sidewall, are removed by etching.

Figure 4B:
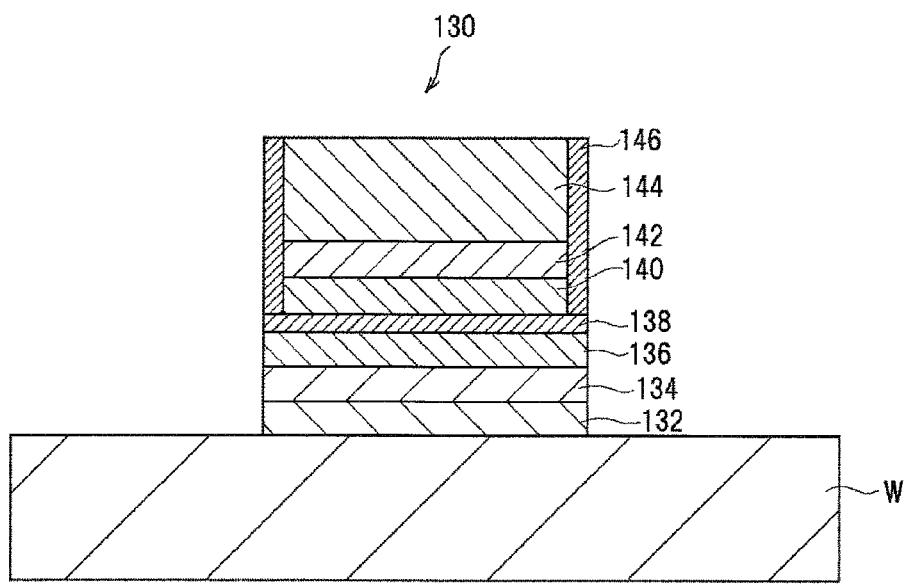
FIG. 4B is a vertical-sectional view schematically illustrating an MRAM structure after a perimeter of the sidewall of the MRAM element is removed by etching.

As a result, an MRAM element 130 having a cross-sectional structure as illustrated in FIG. 4B is obtained. Here, the lower electrode layer 132 is an electrode member having an electrical conductivity formed on the semiconductor wafer W. The thickness of the lower electrode layer 132 is, for example, about 5 nm. The pinning layer 134 is provided between the lower electrode layer 132 and the second magnetic layer 136. The pinning layer 134 fixes the direction of magnetization of the lower electrode layer 132 by a pinning effect by an anti-ferromagnetic material. An available material of the pinning effect 134 is an anti-ferromagnetic material such as, for example, iridium manganese (IrMn) or platinum manganese (PtMn). The thickness of the pinning layer 134 is, for example, about 7 nm.

The second magnetic layer 136 is a layer including a ferromagnetic material arranged on the pinning layer 134. The second magnetic layer 136 functions as a so-called pinned layer in which the direction of magnetization is maintained constantly without being affected by an external magnetic field, due to the pinning effect by the pinning layer 134. An available material of the second magnetic layer 136 is CoFeB, and the thickness thereof is, for example, about 3 nm.

The tunnel barrier layer 138 is interposed between the second magnetic layer 136 and the first magnetic layer 140. Since the tunnel barrier layer 138 is interposed between the second magnetic layer 136 and the first magnetic layer 140, a tunnel magnetoresistance effect occurs between the second magnetic layer 136 and the first magnetic layer 140. That is, an electric resistance in accordance with a relative relation between the magnetization direction of the second magnetic layer 136 and the magnetization direction of the first magnetic layer 140 (parallel or antiparallel) is caused between the second magnetic layer 136 and the first magnetic layer 140. An available material of the tunnel barrier layer 138 is MgO, and the thickness thereof is, for example, about 1.3 nm.

The first magnetic layer 140 is a layer including a ferromagnetic material arranged on the tunnel barrier layer 138. The first magnetic layer 140 functions as a so-called free layer in which the magnetization direction follows depending on an external magnetic field that is magnetic information. An available material of the first magnetic layer 140 is CoFeB, and the thickness thereof is, for example, about 2 nm.

The upper electrode layer 142 is an electrode member having an electrical conductivity formed on the semiconductor wafer W. The thickness of the upper electrode layer 142 is, for example, about 5 nm. The etching mask 144 is formed on the upper electrode layer 142. The etching mask 144 is formed into a shape corresponding to a planar shape of the MRAM 130. For example, tantalum (Ta) or Titanium nitride (TiN) is used for the etching mask 144.

The plasma processing apparatus having the above configuration (FIG. 1) and the plasma processing method (film formation method) in an exemplary embodiment of the present disclosure may be suitably applied to the SiN film formation as described above.

In the film formation method of the exemplary embodiment, as described later, a film formation step $S_3$ of depositing the SiN-containing insulating layer on the workpiece W in the chamber 12 by a plasma CVD method, and a nitriding step $S_6$ of nitriding the SiN-containing insulating layer by a plasma nitriding method are repeated a plurality of times alternately or in a predetermined cycle. In that case, in the film formation step $S_3$, first and second gases each composed of a mixed gas of TSA gas, $N_2$ gas, $H_2$ gas, and Ar gas are introduced from the processing gas supply unit 80 into the chamber 12 through the ceiling gas line 82 and the lower sidewall gas line 84, respectively, in independent composition ratio (flow rate ratio) and flow rate, and a fifth gas composed of a single gas of Ar gas is introduced from the processing gas supply unit 80 into the chamber 12 through the upper sidewall gas line 86 in an independent flow rate. Further, in the nitriding step $S_6$, third and fourth gases each composed of a mixed gas of $N_2$ gas, $H_2$ gas, and Ar gas are introduced from the processing gas supply unit 80 into the chamber 12 through the ceiling gas line 82 and the lower sidewall gas line 84, respectively, in independent composition ratio (flow rate ratio) and flow rate, and a sixth gas composed of a single gas of Ar gas is introduced from the processing gas supply unit 80 into the chamber 12 through the upper sidewall gas line 86 in an independent flow rate.

Figure 5:
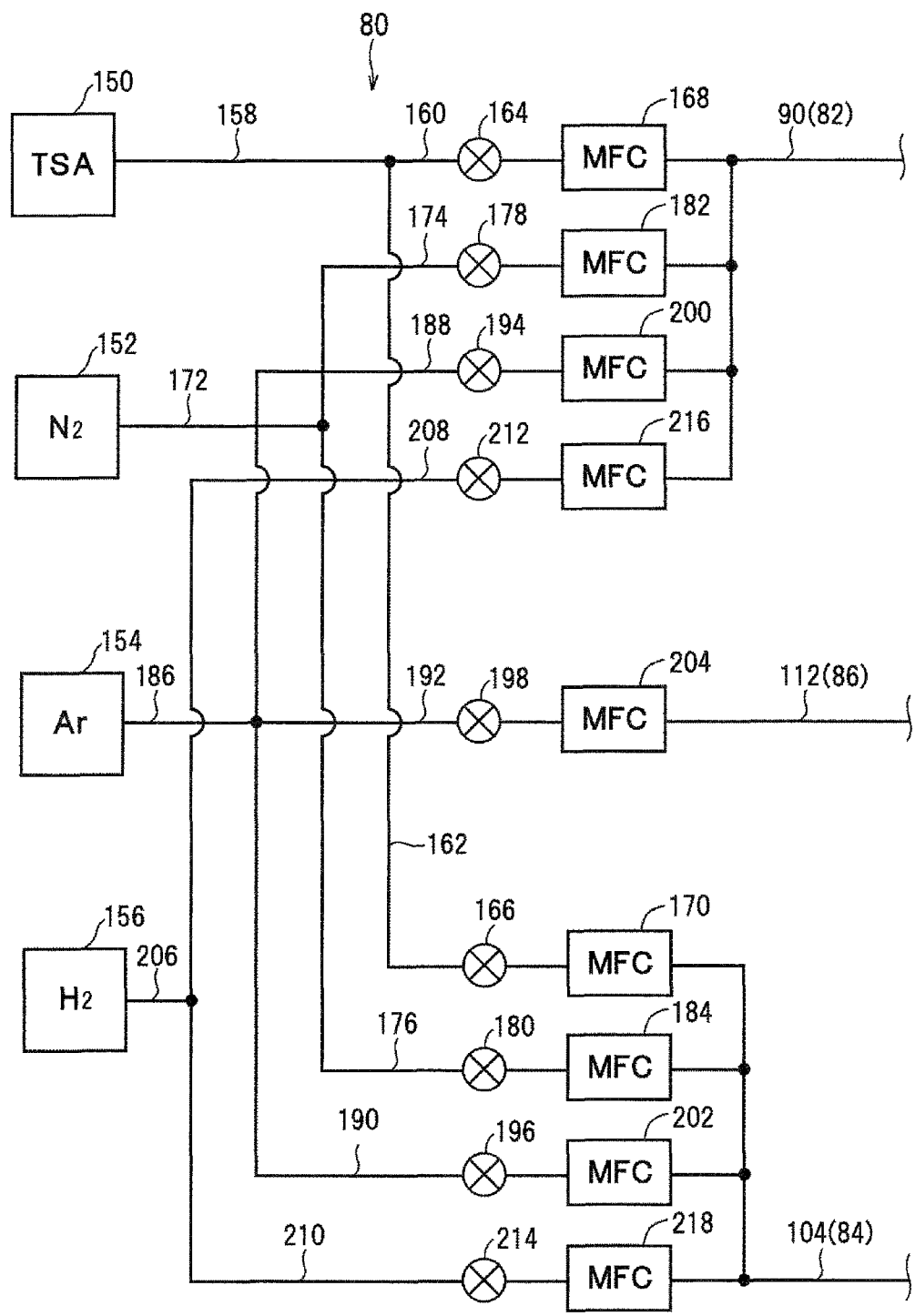
FIG. 5 is a block diagram illustrating an exemplary configuration of a processing gas supply unit used in a film formation method of an exemplary embodiment.

FIG. 5 illustrates a configuration of the processing gas supply unit 80 used in the film formation method of the exemplary embodiment. In this case, the processing gas supply unit 80 is provided with a TSA gas source 150, $N_2$ gas source 152, Ar gas source 154, and $H_2$ gas source 156 that deliver four kinds of gases, that is, TSA gas, $N_2$ gas, $H_2$ gas, and Ar gas, respectively, at a predetermined pressure.

Here, an output port of the TSA gas source 150 is connected to the first gas supply pipe 90 of the ceiling gas line 82 via a TSA gas main line 158 and a first branched TSA gas line 160, and connected to the second gas supply pipe 104 of the lower sidewall gas line 84 via the TSA gas main line 158 and a second branched TSA gas line 162. The first and second branched TSA gas lines 160, 162 are provided with electromagnetic valves (opening/closing valves) 164, 166 and mass flow controllers (MFCs) 168, 170, respectively.

An output port of the $N_2$ gas source 152 is connected to the first gas supply pipe 90 of the ceiling gas line 82 via a $N_2$ gas main line 172 and a first branched $N_2$ gas line 174, and connected to the second gas supply pipe 104 of the lower sidewall gas line 84 via the $N_2$ gas main line 172 and a second branched $N_2$ gas line 176. The first and second branched $N_2$ gas lines 174, 176 are provided with electromagnetic valves (opening/closing valves) 178, 180 and MFCs 182, 184, respectively.

An output port of the Ar gas source 154 is connected to the first gas supply pipe 90 of the ceiling gas line 82 via an Ar gas main line 186 and a first branched Ar gas line 188, connected to the second gas supply pipe 104 of the lower sidewall gas line 84 via the Ar gas main line 186 and a second branched Ar gas line 190, and connected to the third gas supply pipe 112 of the upper sidewall gas line 86 via the Ar gas main line 186 and a third branched Ar gas line 192. The first, second, and third branched Ar gas lines 188, 190, 192 are provided with electromagnetic valves (opening/closing valves) 194, 196, 198 and MFCs 200, 202, 204, respectively.

Further, an output port of the $H_2$ gas source 156 is connected to the first gas supply pipe 90 of the ceiling gas line 82 via a $H_2$ gas main line 206 and a first branched $H_2$ gas line 208, and connected to the second gas supply pipe 104 of the lower sidewall gas line 84 via the $H_2$ gas main line 206 and a second branched $H_2$ gas line 210. The first and second branched $H_2$ gas lines 208, 210 are provided with electromagnetic valves (opening/closing valves) 212, 214 and MFCs 216, 218, respectively.

Figure 6:
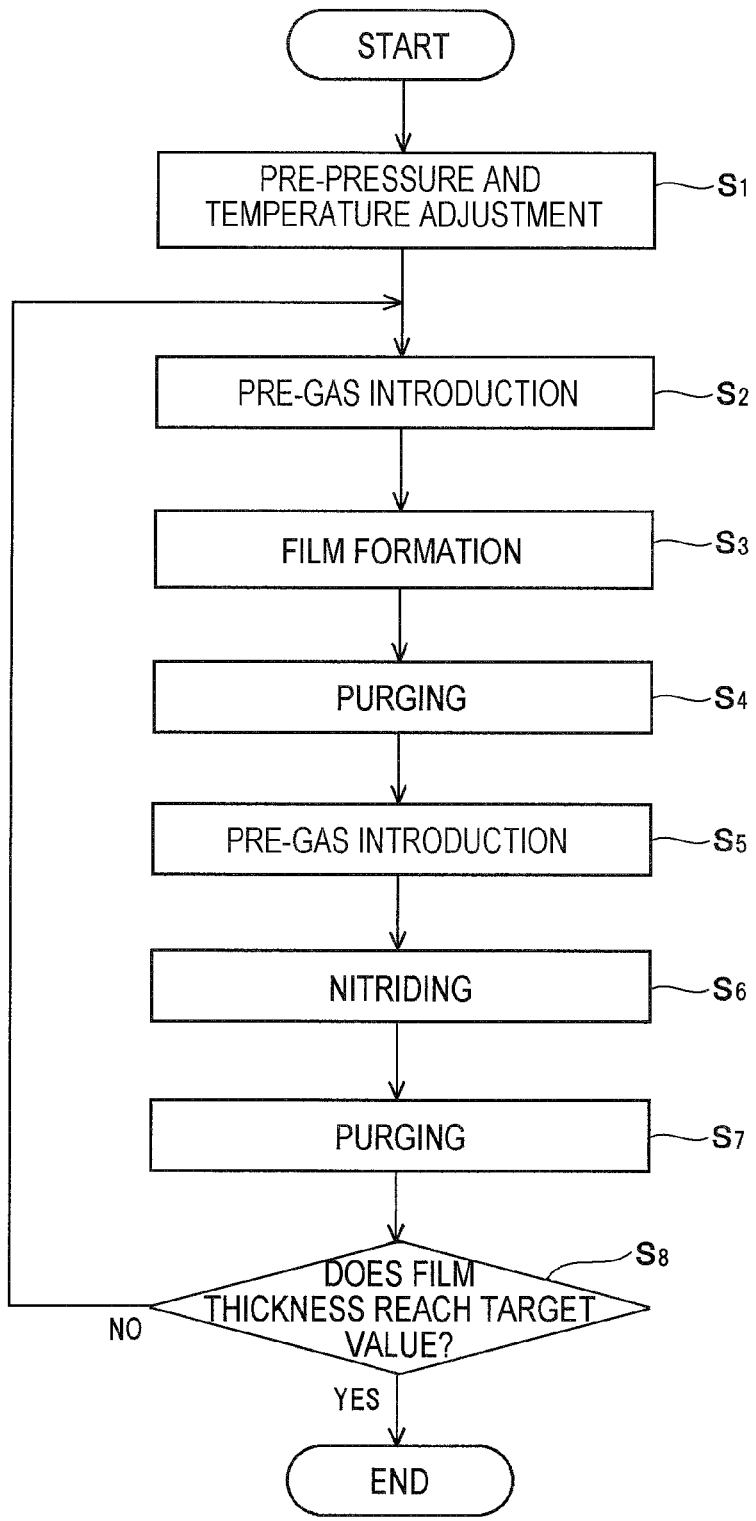
FIG. 6 is a flow chart illustrating a procedure of the film formation method of the exemplary embodiment.

FIG. 6 illustrates a procedure of the film formation method of the exemplary embodiment. As illustrated, after a pre-pressure and temperature adjustment step (step $S_1$), SiN film formation processing of one cycle including a first preliminary gas introduction step (step $S_2$), the film formation step (step $S_3$), a first purging step (step $S_4$), a second preliminary gas introduction step (step $S_5$), the nitriding step (step $S_6$), and a second purging step (step $S_7$) is repeated until the film thickness of the SiN-containing insulating layer reaches a target value.

Figure 7:
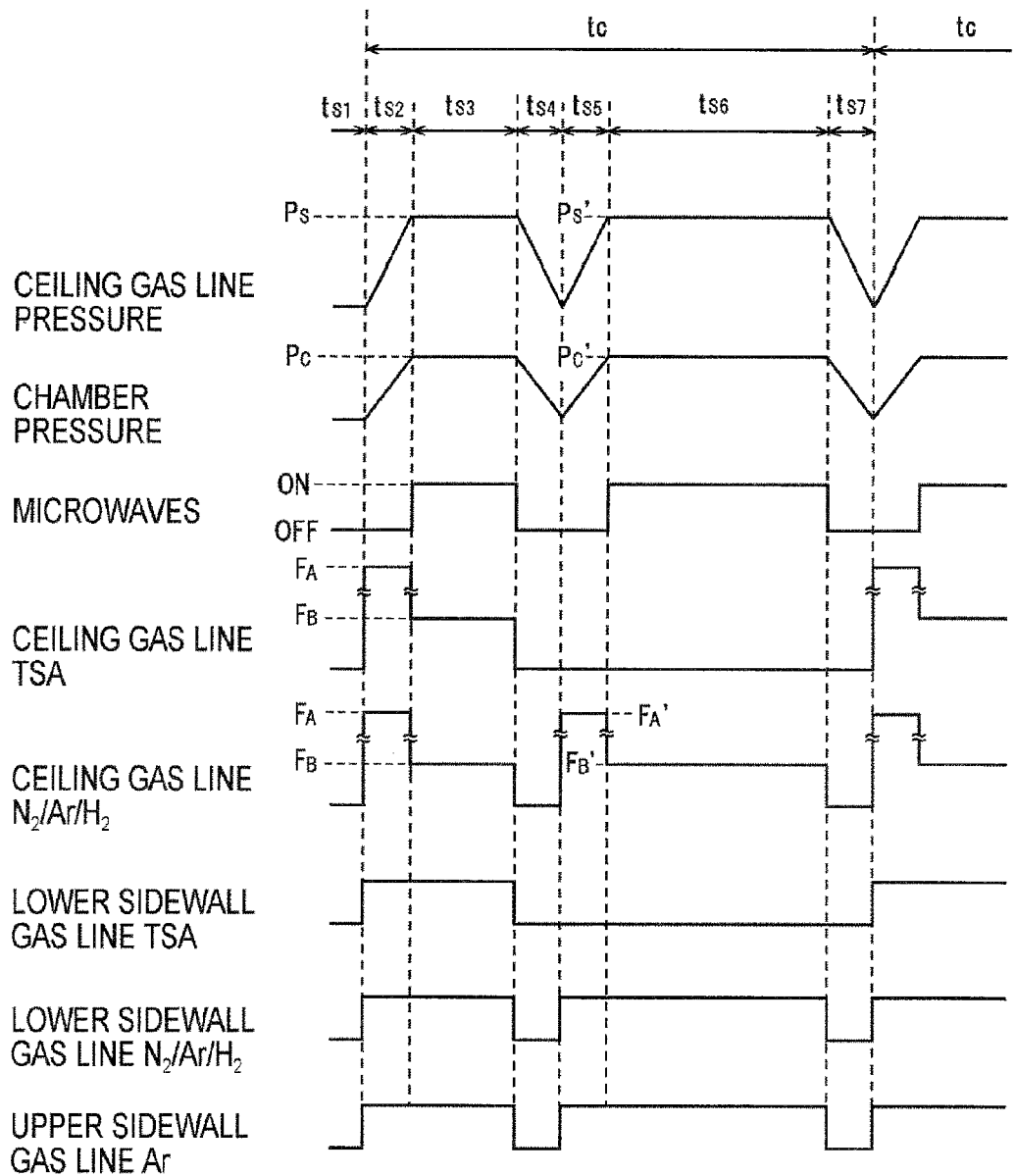
FIG. 7 is a timing chart illustrating a temporal change of each unit in one cycle in the film formation method.

FIG. 7 illustrates a temporal change of each unit in one cycle in the film formation method. In the figure, $t_C$ represents a time required for the SiN film process of one cycle (one period), $t_{S2}$ represents a time required for the preliminary gas introduction step $S_2$, $t_{S3}$ represents a time required for the film formation step $S_3$, $t_{S4}$ represents a time required for the first purging step $S_4$, $t_{S5}$ represents a time required for the second preliminary gas introduction step $S_5$, $t_{S6}$ represents a time required for the nitriding step $S_6$, and $t_{S7}$ represents a time for the second purging step $S_7$.

In the film formation method, after the workpiece W is carried into the chamber 12, a preliminary adjustment (step $S_1$) is performed with respect to the pressure in the chamber 12 and the temperature of each unit. After the preliminary adjustment is completed, the SiN film formation process of the first cycle is started. Further, the pressure in the chamber achieved by the preliminary adjustment is in a base state.

First, a preliminary gas introduction is performed prior to the film formation step $S_3$. In the first preliminary gas introduction step $S_2$, a processing gas for film formation is introduced into the chamber 12 until the pressure in the chamber 12 and the pressure in the ceiling gas line 82 reach from the base value to set values $P_C$, $P_S$, respectively.

More specifically, the first and second gases each composed of a mixed gas of TSA gas, $N_2$ gas, Ar gas, and $H_2$ gas are introduced from the processing gas supply unit 80 into the chamber 12 through the ceiling gas line 82 and the lower sidewall gas line 84, respectively, in independent composition ratio (flow rate ratio) and flow rate, and the fifth gas composed of a single gas of Ar gas is introduced from the processing gas supply unit 80 into the chamber 12 through the upper sidewall gas line 86 in an independent flow rate.

Here, the pressure set value $P_C$ in the chamber 12 is selected as a value suitable for the film formation step $S_3$ (e.g., 400 mTorr to 500 mTorr). Further, the pressure set value $P_S$ in the ceiling gas line 82 is selected as a value capable of suppressing an abnormal discharge in the dielectric window gas flow path 96, that is, a value in a high region significantly deviating from a Paschen discharge region, for example, 100 Torr.

As illustrated in FIG. 7, the first preliminary gas introduction step $S_2$ is characterized in that a flow rate set value $F_A$ of the first processing gas (TSA/N$_2$/Ar/H$_2$) introduced through the ceiling gas line 82 is markedly (preferably, twice to three times) higher than a regular flow rate set value $F_B$ in the film formation step $S_3$.

Figure 8:
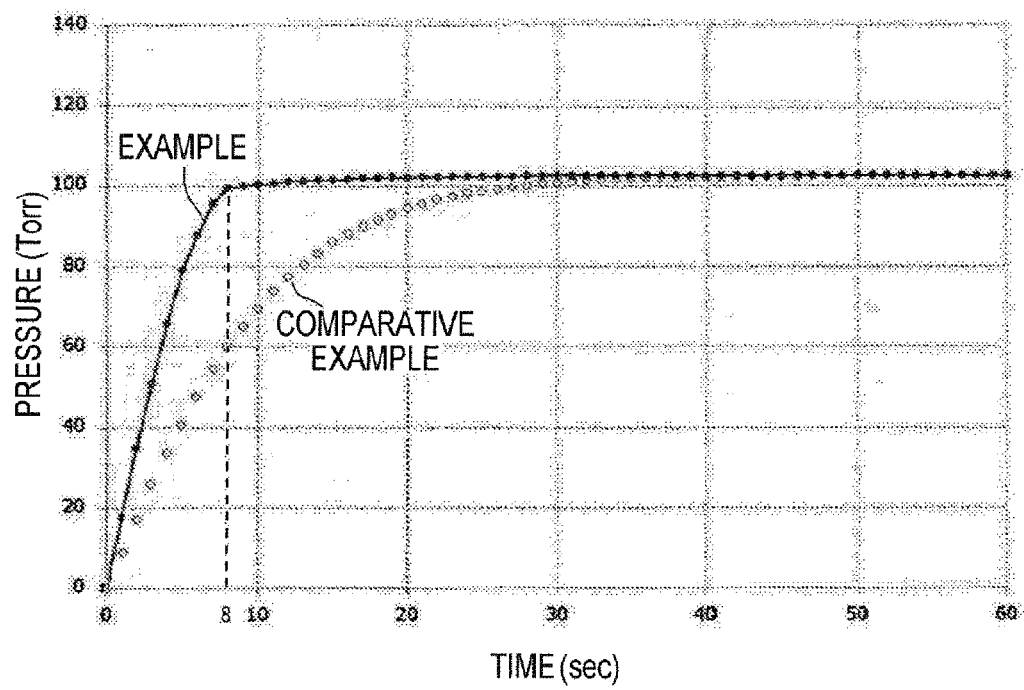
FIG. 8 is a graph illustrating an action of a method of increasing a pressure in a ceiling gas line in a short time in a pre-gas introduction step of the film formation method.

The present inventors have conducted a test with respect to the flow rates of the gases to be introduced into the chamber 12 through the ceiling gas line 82, and compared a case where the preliminary flow rate value $F_A$ in the preliminary gas introduction step until the pressure in the ceiling gas line 82 is increased from the base value to the set value $P_S$ (100 Torr) is equal to the regular flow rate set value $F_B$ (200 sccm) (Comparative Example) and a case where the preliminary flow rate set value $F_A$ (400 sccm) is twice higher than the regular flow rate vale $F_S$ (200 sccm). As a result, as illustrated in FIG. 8, while the time required for the preliminary gas introduction step in Comparative Example is about 30 seconds, the time required for the preliminary gas introduction step in Example is about 8 seconds. Thus, it is confirmed that the time may be reduced to ⅓ or less.

In the first preliminary gas introduction step $S_2$, the time point when the pressure in the ceiling gas line 82 reaches the set value $P_S$ may be substantially equal to or earlier than (prior to) the time point when the pressure in the chamber 12 reaches the set value $P_C$, or may be somewhat delayed. Further, the flow rate set value of the first processing gas (TSA/N$_2$/Ar/H$_2$) may be changed from the preliminary flow rate set value $F_A$ to the regular flow rate set value $F_B$ in the middle of the preliminary gas introduction step $S_2$.

When the first preliminary gas introduction step $S_2$ is completed, the film formation step $S_3$ is started. In the film formation step $S_3$, microwaves are introduced at a predetermined power from the microwave supply unit 14 into the chamber 12 through the dielectric window 18. In the gas system, except that the flow rate of the first processing gas (TSA/N$_2$/Ar/H$_2$) introduced from the ceiling gas line 82 is changed to the regular flow rate as described above, the flow rates of the second processing gas (TSA/N$_2$/Ar/H$_2$) introduced from the lower sidewall gas line 84 and the fifth processing gas (Ar) introduced from the upper sidewall gas line 86 are maintained at the same value as before.

In the film formation step $S_3$, when the microwaves are introduced from the microwave supply unit 14 into the chamber 12 through the dielectric window 18, the gas near the inner surface of the dielectric window 18 is ionized by the electric field (microwave electric field) of the surface waves propagated in the radial direction along the inner surface of the dielectric window 18, so that plasma having a low electron temperature at high density is generated. In this case, the gas molecules of the fifth processing gas (Ar) injected from the upper sidewall gas injection port 110 of the upper sidewall gas line 86 along the lower surface (inner surface) of the dielectric window 18 are efficiently ionized by the collision with the electrons accelerated by the microwave electric field, and dominantly contribute to the generation of the plasma having a low electron temperature at high density.

Meanwhile, the gas molecules of the first processing gas (TSA/N$_2$/Ar/H$_2$) injected from the ceiling gas injection port 94 of the ceiling gas line 82 toward the central portion of the stage 20, especially, the TSA gas molecules are partially ionized by the collision with the electrons accelerated by the microwave electric field immediately after exiting from the ceiling gas injection port 94, but mostly dissociated by the collision with the high-speed electrons in the high-density plasma generated from the fifth processing gas (Ar), thereby generating various radical active species.

Similarly, the gas molecules of the first processing gas (TSA/N$_2$/Ar/H$_2$) injected from the lower sidewall gas injection port 102 of the lower sidewall gas line 84 toward the peripheral portion of the stage 20, especially, the TSA gas molecules are mostly dissociated by the collision with the high-speed electrons in the high-density plasma generated from the fifth processing gas (Ar), thereby generating various radical active species.

More specifically, the TSA gas supplied into the chamber 12 through the ceiling gas line 82 and the lower sidewall gas line 84 is dissociated by the collision with the electrons under the microwave electric field or in the high-density plasma as described above to generate various free radicals, that is, (SiH$_3$)$_2$N—SiH$_2$, SiH$_3$NH—SiH$_2$, NH$_2$—SiH$_2$, (SiH$_3$)$_2$N, SiH$_3$—HN, H$_2$N, and the like, which contribute to the formation of the SiN film. Above all, (SiH$_3$)$_2$N—SiH$_2$, SiH$_3$NH—SiH$_2$, or NH$_2$—SiH$_2$ serves as a main film formation precursor because of its low adsorption probability for a silicon substrate, and is deposited onto the workpiece W to form the SiN-containing insulating film.

Further, in the exemplary embodiment, since H$_2$ is added to TSA in the first and second processing gases, the adsorption probability of the film formation precursor onto the workpiece W is further reduced, so that the coverage of the SiN-containing insulating film is further enhanced.

Figures 10, 11:
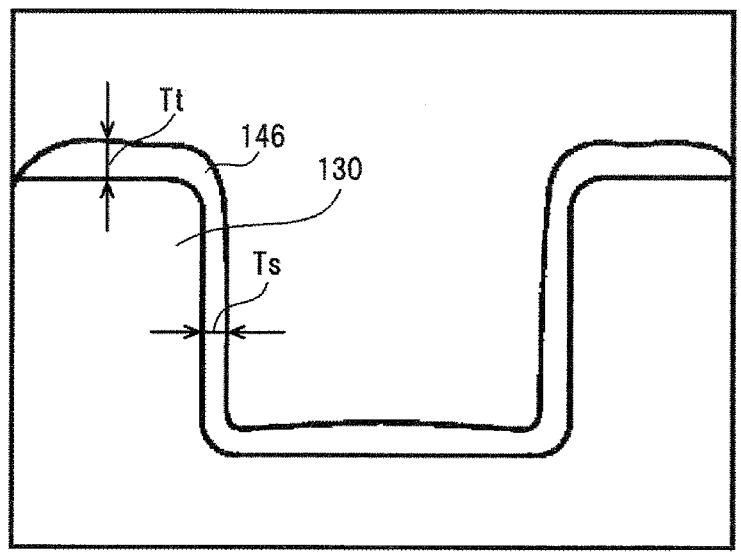
FIG. 10 is a view illustrating a coverage of a SiN-containing insulating film obtained according to the film formation method of the exemplary embodiment.
FIG. 11 is a view illustrating a definition of the coverage.

In this regard, the present inventors have conducted a test by selecting 35 sccm, 70 sccm, and 87 sccm as the total flow rate of the H$_2$ gas contained in the first and second processing gases, under the film formation conditions as follows. As a result, as illustrated in FIG. 10, the coverages of the SiN-containing insulating film 146 were 83%, 88%, and 91%, respectively. Further, as illustrated in FIG. 11, the coverage is represented by a ratio ($T_S/T_t$) of a film thickness $T_S$ of the SiN-containing insulating film 146 formed on the sidewall of the MRAM element 130 and a film thickness $T_t$ of the SiN-containing insulating film 146 formed on the top surface of the MRAM element 130:

[Film Formation Conditions of Example]
Power of microwaves: 4,000 W
Pressure in chamber: 0.95 Torr
Processing temperature: 300° C.
Total flow rate of first and second processing gases
  TSA gas: 2.2 sccm
  N$_2$ gas: 2.8 sccm
  Ar gas: 2,850 sccm
  H$_2$ gas: 35 sccm, 70 sccm, 87 sccm (three cases)

Therefore, it is confirmed that the SiN-containing insulating film 146 having an excellent coverage characteristic may be formed by using the first and second processing gases in which H$_2$ gas is added to TSA in the film formation step $S_3$. Further, it is confirmed that, as the composition ratio (flow rate ratio) or the flow rate of H$_2$ gas added increases, the coverage of the SiN-containing insulating film 146 is enhanced.

Figure 12:
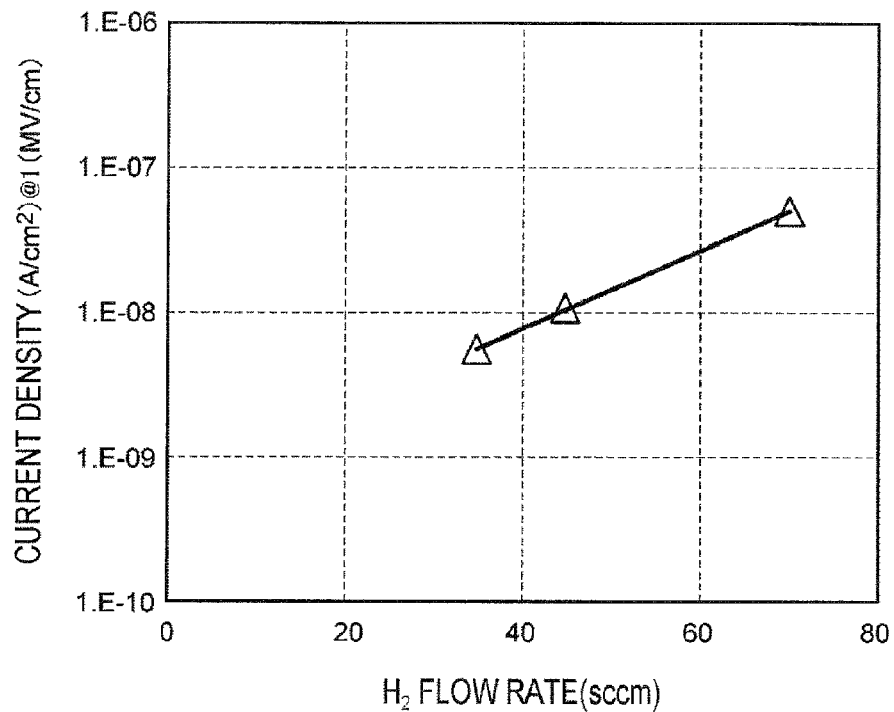
FIG. 12 is a graph illustrating an electric insulation change characteristic of the SiN-containing insulating film when the flow rate of $H_2$ to be added to TSA is changed in the film formation method of the exemplary embodiment.

Above all, as illustrated in FIG. 12, it has been found from the same test that there is a trade-off problem in that, as the flow rate of H$_2$ gas added to TSA increases, SiH increases in the SiN-containing insulating film 146, thereby deteriorating the electrical insulation characteristic. Further, FIG. 12 is a graph illustrating a H$_2$ flow rate dependence of a current density of the current generated in the SiN-containing insulating film 146 when applying an electric field of 1 MV/cm to the SiN-containing insulating film 146. The horizontal axis represents a $H_2$ flow rate (sccm), and the vertical axis represents a current density ($A/cm^2$). As illustrated, it is found that, as the flow rate of $H_2$ increases, the current density increases, that is, the electric insulation characteristic is deteriorated. This is because the flow rate of $H_2$ increases, so that SiH increases in the SiN-containing insulating film 146.

Figure 13:
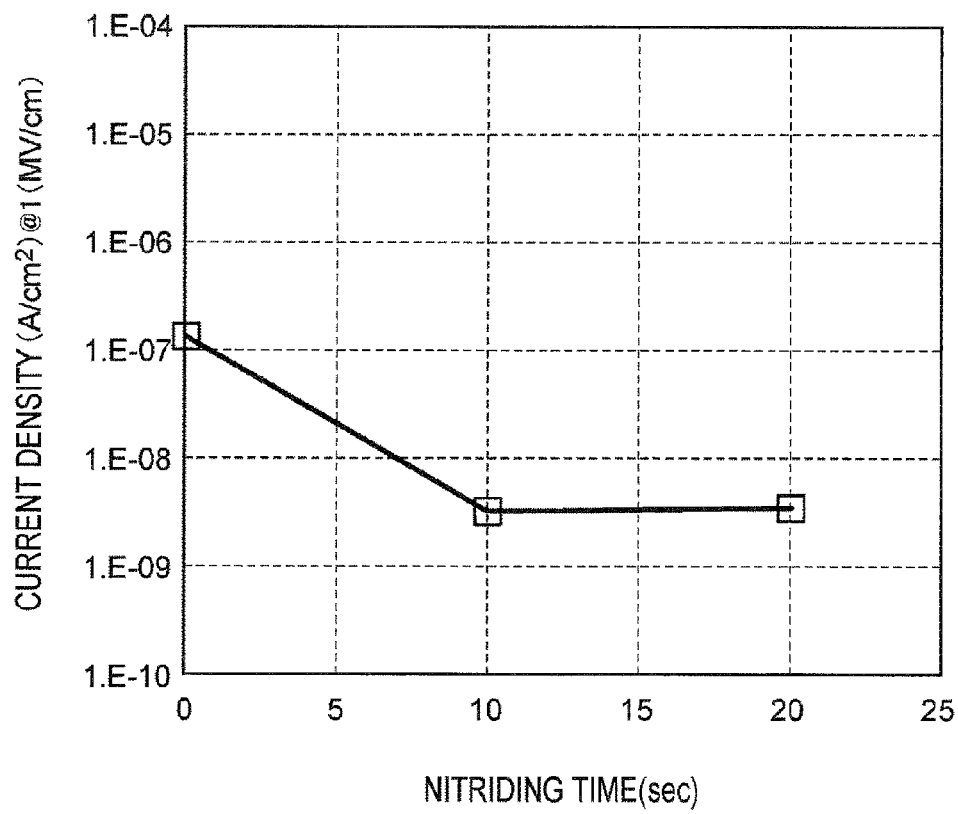
FIG. 13 is a graph illustrating an electric insulation change characteristic of the SiN-containing insulating film when the nitriding time is changed in the film formation method of the exemplary embodiment.

In the exemplary embodiment, since the SiH in the SiN-containing insulating film 146 is reduced by the nitriding step $S_6$ performed after the film formation step $S_3$ as illustrated in FIG. 13, the electric insulation characteristic may be improved. Thus, the trade-off problem is solved. Further, FIG. 13 is a graph illustrating a nitriding time dependence of a current density of the current generated in the SiN-containing insulating film 146 when applying an electric field of 1 MV/cm to the SiN-containing insulating film 146. The horizontal axis represents a nitriding time (sec), and the vertical axis represents a current density ($A/cm^2$). As illustrated, within 10 seconds of the nitriding time, the current density decreases as the nitriding time increases. Thus, the electric insulation characteristic is enhanced. However, when the nitriding time exceeds 10 seconds, the current density is substantially unchanged. Thus, it is understood that the electric insulation characteristic is saturated.

When the supply of the microwaves from the microwave supply unit 14 is stopped, the film formation step $S_3$ is completed. In the gas system, the gas supply from the processing gas supply unit 80 is stopped, and the electromagnetic valves 91, 106, 114 in the ceiling gas line 82, the lower sidewall gas line 84, and the upper sidewall gas line 86 are switched from the previous ON state to OFF state. Then, the first purging step $S_4$ is started.

In the first purging step $S_4$, the valve of the pressure adjustor 55 is switched from the previous OFF state to ON state, and the chamber 12 is exhausted or purged by the exhaust device 56 until the pressure of the base value is achieved. In this case, any unreacted gas or gas of the reaction products remaining in the chamber 12 is exhausted from the exhaust hole 12h to the exhaust device 56 through the pressure adjustor 55.

Meanwhile, in the first purging step $S_4$, the electromagnetic valve 118 of the bypass exhaust line 116 is switched to ON state. Therefore, the gas flow paths 90, 88, 92a, 96 at the downstream side of the electromagnetic valve 91 in the ceiling gas line 82 are exhausted or purged through the bypass exhaust line 116 by the exhaust device 56 until the pressure of the base value is achieved. As described above, the outlet side of the dielectric window gas flow path 96, that is, the ceiling gas injection port 94 is very small in diameter. Thus, the conductance is low. Therefore, most of the gas remaining in the gas flow paths 90, 88, 92a, 96 at the downstream side of the magnetic valve 91, particularly, the gas remaining in the dielectric window gas flow path 96 is rapidly discharged to the exhaust device 56 side through an external exhaust route of the dielectric window gas flow path 96→the gas flow path 92a of the connector 92→the gas flow path 88 of the coaxial waveguide 16→the first gas supply pipe 90 the bypass exhaust line 116→the exhaust device 56.

Figure 9:
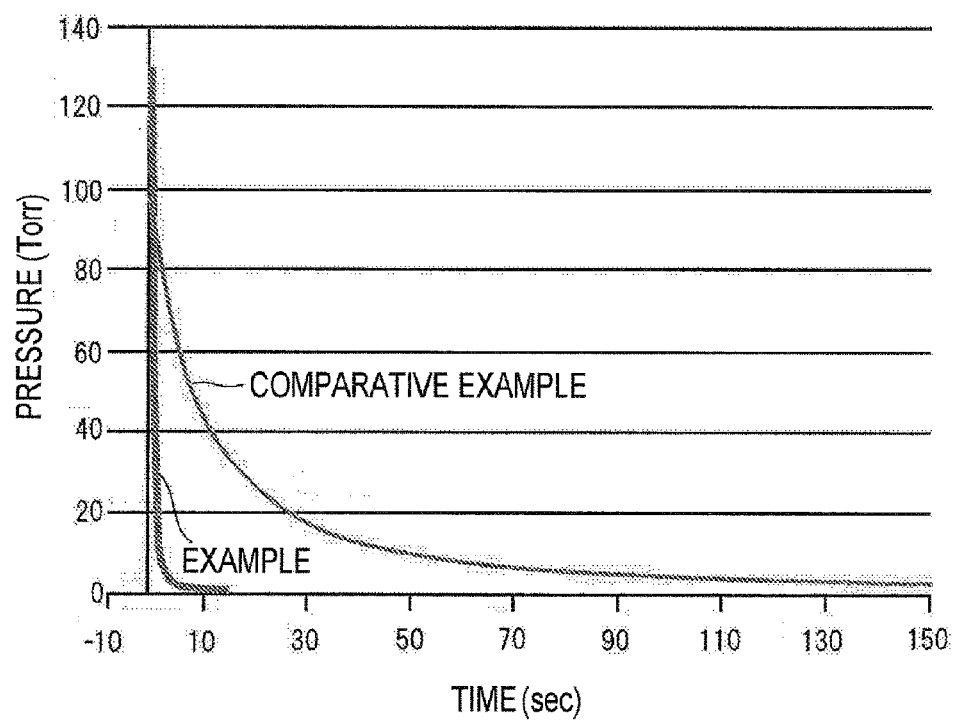
FIG. 9 is a graph illustrating an action of a method of decreasing the pressure in the ceiling gas line through an external exhaust line in a short time in a purging step of the film formation method.

The present inventors have experimentally measured the time required to exhaust the residual gas in the dielectric window gas flow path 96 until the base pressure (1 Torr or less) is achieved in the purging step in a case where the gas is exhausted in the external exhaust route using the bypass exhaust line 116 as described above (Example), and in a case where the gas is exhausted in an inner exhaust route of the dielectric window gas flow path 96→the ceiling gas injection port 94→the inside of the chamber 12→the exhaust hole 12h→the exhaust device 56 without using the bypass exhaust line 116 (Comparative Example). As a result, as illustrated in FIG. 9, Comparative Example requires about 100 seconds, whereas Example requires only about 5 seconds. Therefore, it is confirmed that the time required for purging may be remarkably reduced.

Figure 15:
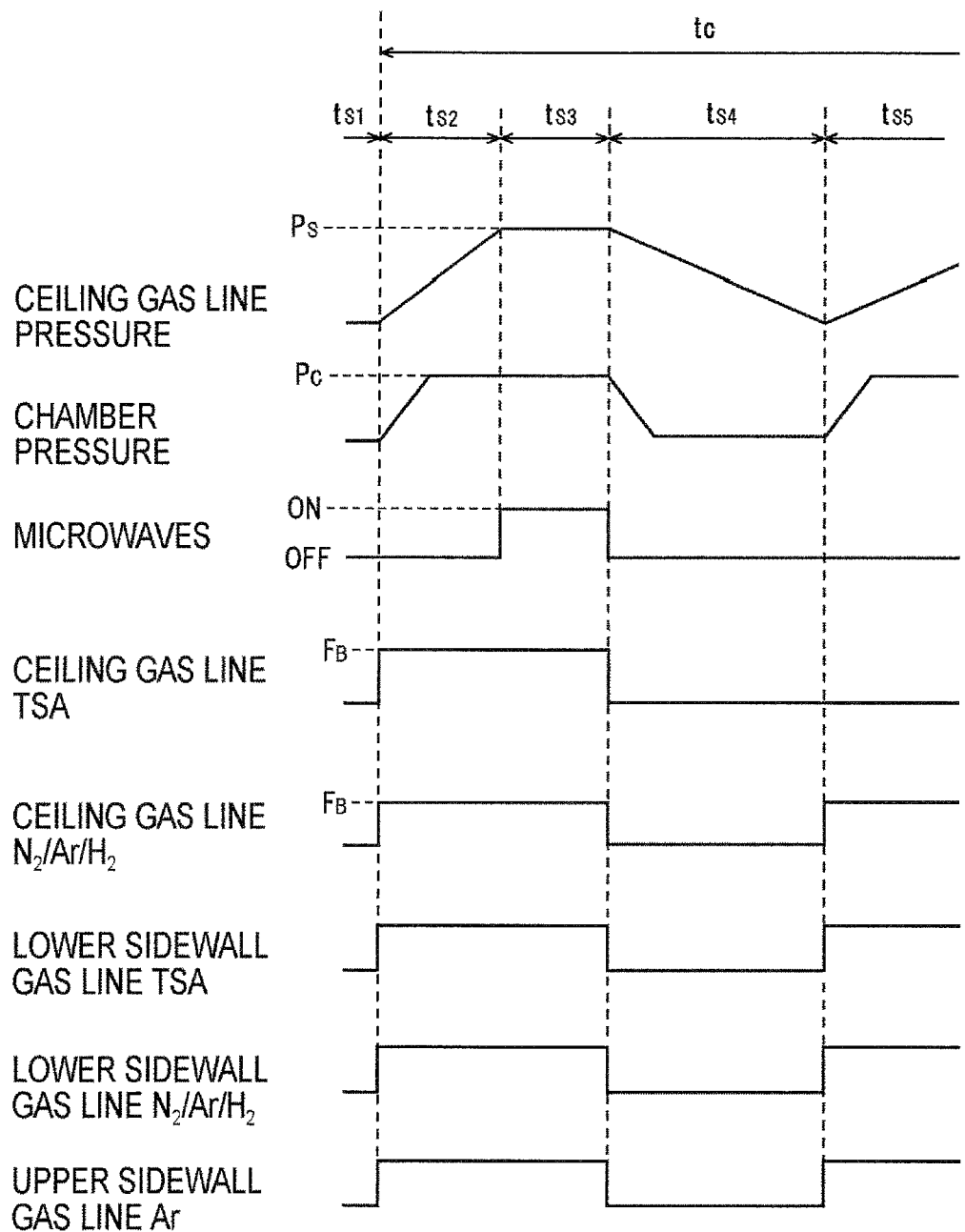
FIG. 15 is a timing chart illustrating a temporal change of each unit in a case of not using a time shortening method of the present disclosure in the first pre-gas introduction step and the first purging step of the film formation process of the exemplary embodiment.

As Reference Example (Comparative Example), FIG. 15 illustrates a temporal change of each unit in a case where the preliminary flow rate set value is set to be equal to the regular flow rate set value $F_B$ in the first preliminary gas introduction step $S_2$, and the external exhaust rout is not used in the first purging step $S_4$.

When the first purging step $S_4$ as described above is completed, the second preliminary gas introduction gas $S_5$ is started. In the second preliminary gas introduction step $S_5$, as illustrated in FIG. 7, a processing gas for nitriding is introduced into the chamber 12 until the pressure in the chamber 12 and the pressure in the ceiling gas line 82 reach from the base value to set values $P_C'$, $P_S'$, respectively.

More specifically, the third and fourth gases each composed of a mixed gas of $N_2$ gas, Ar gas, and $H_2$ gas are introduced from the processing gas supply unit 80 into the chamber 12 through the ceiling gas line 82 and the lower sidewall gas line 84, respectively, in independent composition ratio (flow rate ratio) and flow rate, and the sixth gas composed of a single gas of Ar gas is introduced into the chamber 12 through the upper sidewall gas line 86 in an independent flow rate.

Here, the pressure set value $P_C'$ in the chamber 12 is selected to have a value suitable for the nitriding step $S_6$ (e.g., 400 mTorr to 500 mTorr). Further, the pressure set value $P_S'$ in the ceiling gas line 82 is selected to have a value capable of suppressing an abnormal discharge in the dielectric window gas flow path 90, that is, a value in a high region significantly deviating from a Paschen discharge region, for example, 100 Torr.

The second preliminary gas introduction step $S_5$ is also characterized in that a flow rate set value $F_A'$ of the third processing gas ($N_2/Ar/H_2$) introduced through the ceiling gas line 82 is markedly (preferably, twice to three times) higher than a regular flow rate set value $F_B'$ in the nitriding step $S_6$. Therefore, the required time $t_{S5}$ is remarkably reduced.

When the second preliminary gas introduction step $S_5$ is completed, the nitriding step $S_6$ is started. Also in the nitriding step $S_6$, microwaves are introduced at a predetermined power from the microwave supply unit 14 into the chamber 12 through the dielectric window 18. In the gas system, except that the flow rate of the third processing gas ($N_2/Ar/H_2$) introduced from the ceiling gas line 82 is changed from the preliminary flow rate to the regular flow rate, the flow rates of the fourth processing gas ($N_4/Ar/H_2$) introduced from the lower sidewall gas line 84 and the sixth processing gas (Ar) introduced from the upper sidewall gas line 86 are maintained at the same value as before.

Also in the nitriding step $S_6$, the required gases are introduced from the three systems of the ceiling gas line 82, the lower sidewall gas line 84, and the upper sidewall gas line 86 into the chamber 12, and the microwaves are introduced from the microwave supply unit 14 into the chamber 12 through the dielectric window 18, so that the gas molecules of the respective gases are ionized or dissociated by the collision with the high-speed electrons in the plasma, thereby generating various active species. Among the active species, ions or radicals containing nitrogen infiltrate into the SiN-containing insulating layer on the workpiece W and replace SiH with SiN. By the nitriding, the amount of SiH in the SiN-containing insulating layer, so that the electrical insulation characteristic is enhanced.

The present inventors have experimentally studied a correlation between the processing time $t_{S6}$ of the nitriding step $S_6$ and the improvement of the electrical insulation characteristic in the SiN-containing insulating film, and has found that, as illustrated in FIG. 13, since the improvement effect of the insulation characteristic is exhibited as soon as the nitriding is performed (that is, in a short time), the insulation characteristic is improved in proportion to the nitriding time $t_{S5}$, but when the nitriding time $t_{S5}$ exceeds 10 seconds, the insulation characteristic is no longer enhanced. Further, FIG. 13 is a graph illustrating a current density of the current generated in the insulating film 146 when applying an electric field of 1 MV/cm to the SiN-containing insulating film 146 every processing time $t_{S6}$ of the nitriding step $S_6$.

The nitriding step $S_6$ is completed when the supply of the microwaves from the microwave supply unit 14 is stopped. In the gas system, the gas supply from the processing gas supply unit 80 is stopped, and the electromagnetic valves 91, 106, 114 in the ceiling gas line 82, the lower sidewall gas line 84, and the upper sidewall gas line 86 are switched from the previous ON state to OFF state. Subsequently, the second purging step $S_7$ is started.

In the second purging step $S_7$, the valve of the pressure adjustor 55 is switched from the previous OFF state to ON state, and the chamber 12 is exhausted or purged by the exhaust device 56 until the pressure of the base value is achieved. In this case, any unreacted gas or gas of the reaction products remaining in the chamber 12 is exhausted from the exhaust hole 12h to the exhaust device 56 through the pressure adjustor 55.

Meanwhile, in the second purging step $S_7$, any unreacted gas or gas of the reaction products remaining in the chamber 12 is also sent from the exhaust hole 12h to the exhaust device 56 through the pressure adjustor 55. Then, the electromagnetic valve 118 of the bypass exhaust line 116 is switched to ON state. Therefore, the gas flow paths 90, 88, 92a, 96 at the downstream side of the electromagnetic valve 91 in the ceiling gas line 82 are exhausted or purged through the bypass exhaust line 116. Therefore, most of the gas remaining in the gas flow path 96 is discharged to the exhaust device 56 side through the external exhaust route of the dielectric window gas flow path 96→the gas flow path 92a of the connector 92→the gas flow path 88 of the coaxial waveguide 16→the first gas supply pipe 90 the bypass exhaust line 116→the exhaust device 56. Thus, the time $t_{S7}$ required for the second purging step $S_4$ is considerably reduced as compared with the case where the external exhaust rout including the bypass exhaust line 116 is unused.

When the second purging step $S_7$ is completed, the process proceeds to the next SiN film formation cycle, and the same steps $S_2$ to $S_7$ are repeated. In this example, the SiN film formation cycle is repeated until the film thickness of the SiN-containing insulating film 146 reaches a target value. However, in another example, when the number of times of repetition of the SiN film formation cycle reaches a set value, it may be considered that the film thickness of the SiN-containing insulating film 146 reaches the target value, so that the whole process is completed at that time.

Figure 14A:
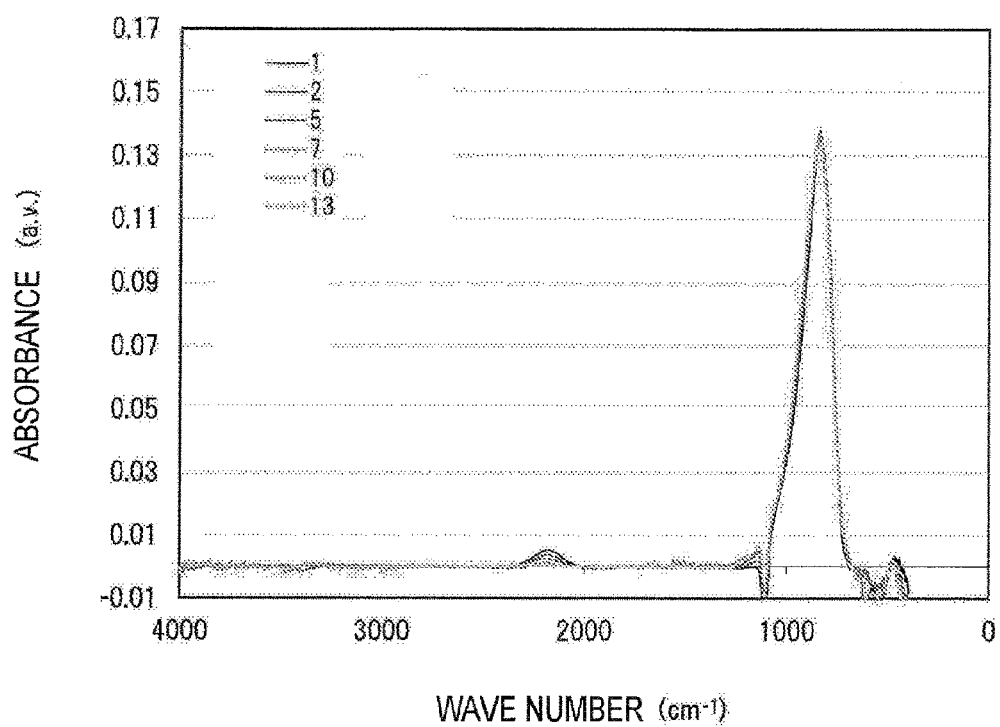
FIG. 14A is a view illustrating an FT-IR spectrum waveform change characteristic of the SiN-containing insulating film when the number of repetition of the SiN film formation cycles is changed to obtain the same film thickness in the film formation method of the exemplary embodiment.
Figure 14B:
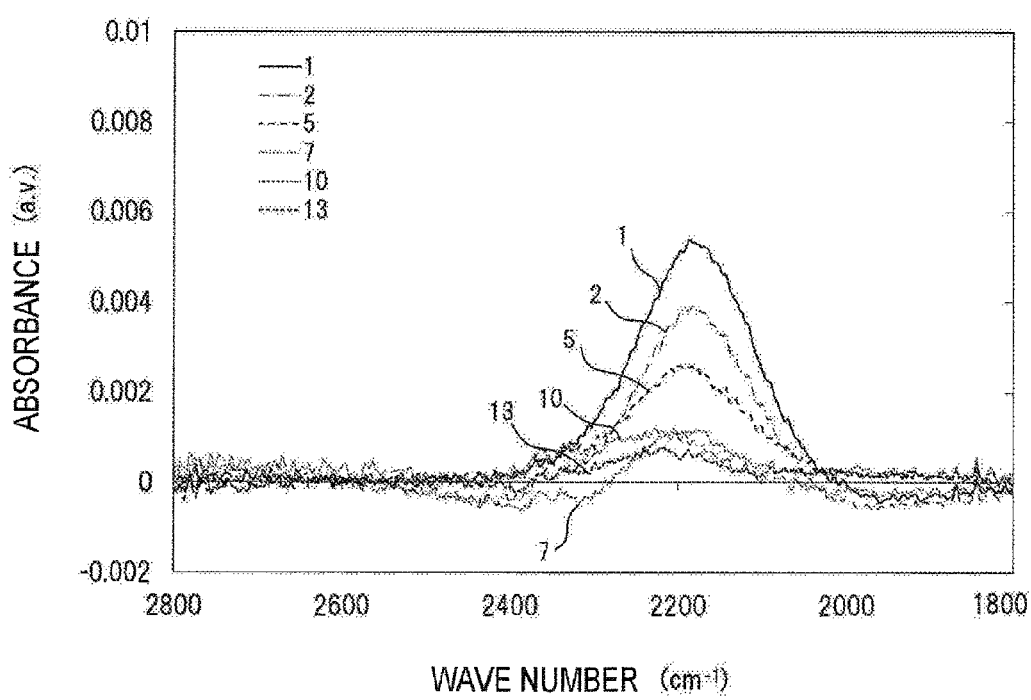
FIG. 14B is a partially enlarged view illustrating the FT-IR spectrum waveform in a part of a wavenumber region (2,800 $cm^{-1}$ to 1,800 $cm^{-1}$) of FIG. 14A in an enlarged scale.

According to the test conducted by the present inventors, it has been found from the spectrum waveform of the Fourier transform infrared spectroscopy (FT-IR spectroscopy) as illustrated in FIGS. 14A and 14B that, in the film formation method of the above exemplary embodiment, in order to obtain the same film thickness, as the number of repetition of the SiN film formation cycle ($S_2$ to $S_7$) is increased, in other words, as the film thickness per cycle is decreased, the amount of the SiH contained in the SiN-containing insulating film 146 is reduced, that is, the electric insulation characteristic is enhanced.

In the exemplary embodiment, the times $t_{S2}$, $t_{S5}$ required for the first and second preliminary gas introduction steps $S_2$, $S_5$ and the time $t_{S4}$, $t_{S7}$ required for the first and second purging steps $S_4$, $S_7$ in the SiN film formation cycle may be remarkably reduced as described above. Therefore, the electric insulation characteristic of the SiN-containing insulating film 146 may be sufficiently improved by arbitrarily increasing the number of repetition of the SiN film formation cycle.

As described above, according to the plasma processing apparatus and the plasma processing method (film formation method) in the exemplary embodiment, in the SiN film formation process of alternately repeating the film formation step $S_3$ of forming the SiN-containing insulating layer on the workpiece W in a uniform film thickness and the nitriding step $S_6$ of nitriding the SiN-containing insulating layer, it is possible to obtain the SiN-containing insulating film 146 for MRAM having the coverage characteristic and the electric insulation characteristic at high levels by reducing the SiN film formation cycle while suppressing an abnormal discharge into the dielectric window gas flow path 96 constituting a part of the ceiling gas line 82.

Further, unlike the case where the SiN-containing insulating film is formed according to the ALD method, in the exemplary embodiment, the SiN-containing insulating film 146 of a good film quality may be formed without using a halogen material such as, for example, dichlorosilane, and without corroding metal portions provided in the MRAM element 130.

Further, the plasma processing apparatus of the exemplary embodiment includes, as gas introduction mechanisms for introducing the processing gases provided from the processing gas supply unit 80 into the chamber 12, the ceiling gas line (first gas introduction unit) 82 including the gas flow path 96 and the gas injection port 94 provided in the dielectric window 18, the lower sidewall gas line (second gas introduction unit) 84 including the gas flow path or the buffer chamber 100 and the gas injection ports 102 provided at a height position in the middle of the dielectric window 18 and the stage 20, and the upper sidewall gas line (third gas introduction unit) 86 including the gas flow path or the buffer chamber 108 and the gas injection ports 110 provided at a height position close to the dielectric window 18, as described above.

In a case where a film formation process similar to the above exemplary embodiment is performed using the plasma processing apparatus, the feedstock processing gases (first, second, third, and fourth processing gases) are introduced from the ceiling gas line 82 and the lower sidewall gas line 84, and the processing gases for plasma generation (fifth and sixth processing gases) are introduced from the upper sidewall gas line 86. According to the gas introduction mechanisms, the gases for plasma generation generate high-density plasma by the microwave discharge, and the feedstock processing gases are uniformly efficiently excited in the central portion and the peripheral portion of the plasma generating space S by the high-density plasma, so that radical active species or film formation precursors are produced and diffused with uniform density on the workpiece W. Therefore, the in-plane uniformity of the film formation characteristics (film quality and film thickness) of the SiN-containing insulating film 146 may be enhanced.

Further, according to the plasma processing apparatus of the exemplary embodiment, as described below, the processing temperature, which is one of the process conditions in the film formation method for forming the SiN-containing insulating film on the workpiece W, may be set in a wide range.

In the test of the examples, it was possible to obtain a SiN-containing insulating film for MRAM having high-level coverage and electric insulation characteristics at a processing temperature of 300° C. The present inventors used the processing temperature as a parameter, selected a plurality of set values stepwise in a range of 100° C. to 300° C., and conducted a test for the same SiN film formation process as in the examples (additional test). Then, the results as illustrated in FIGS. 16 to 19C were obtained.

In the additional test, the kinds of processing gases are the same as in the examples, but set values of other conditions (power of microwaves, pressure in the chamber, gas flow rates, and the like) are somewhat different from the examples. The purpose of the additional test is to qualitatively research the processing temperature dependence of the characteristics of the SiN-containing insulating film (particularly, the coverage characteristic and the electrical insulation characteristics) within a predetermined temperature range. Although set values of other conditions are slightly changed, the qualitative tendency or profile of the processing temperature dependence within a predetermined temperature range is basically the same. Strictly, the stage temperature is slightly higher than the temperature of the workpiece (semiconductor wafer) W, but typically, the stage temperature may be equated with the temperature (processing temperature) of the workpiece W.

Figure 16:
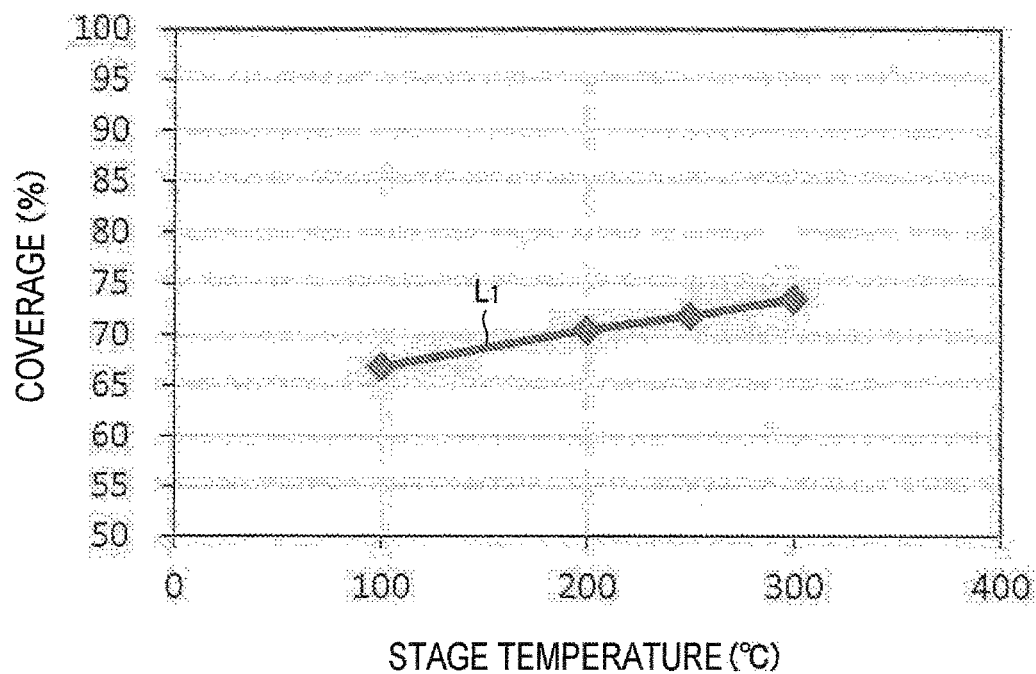
FIG. 16 is a graph illustrating a processing temperature dependence of the coverage with respect to the SiN-containing insulating film obtained in an additional test of the exemplary embodiment.

FIG. 16 illustrates the processing temperature dependence of the coverage ($T_S/T_t$ in FIG. 11) with respect to the SiN-containing insulating film obtained in the additional test. As illustrated, all plots are distributed along an approximate line $L_1$ having a relatively moderate slope. As the stage temperature (processing temperature) increases, the coverage increases.

Figure 17:
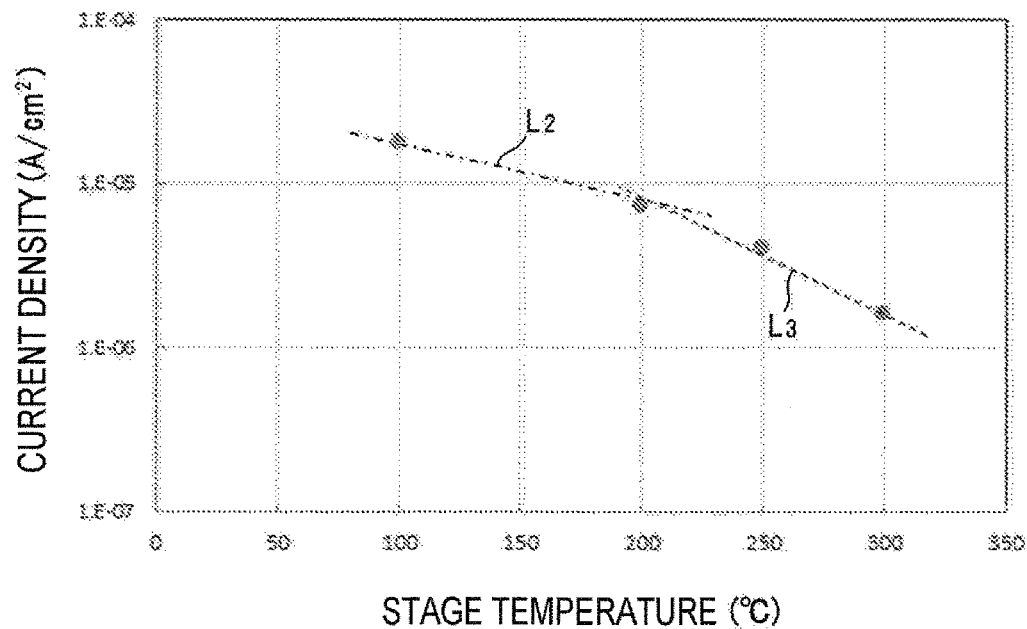
FIG. 17 is a graph illustrating a processing temperature dependence of the electrical insulation characteristic with respect to the SiN-containing insulating film in the additional test.

FIG. 17 illustrates the processing temperature dependence of the current density of the current generated in the SiN-containing insulating film when applying an electric field of 2 MV/cm to the SiN-containing insulating film. As illustrated, there is a rough tendency that, as the stage temperature (processing temperature) increases, the current density decreases. Thus, the electric insulation characteristic is enhanced.

More precisely, a rate of decrease in current density/temperature in a temperature region of 200° C. to 300° C. (a negative slope of an approximate line $L_3$) is larger than a rate of decrease in current density/temperature in a temperature region of 100° C. to 200° C. (a negative slope of a line $L_2$). Since FIG. 17 represents the current density of the vertical axis in exponential notation, the actual difference between the slopes of the lines $L_2$, $L_3$ (in normal notation) is considerably large.

Figure 18:
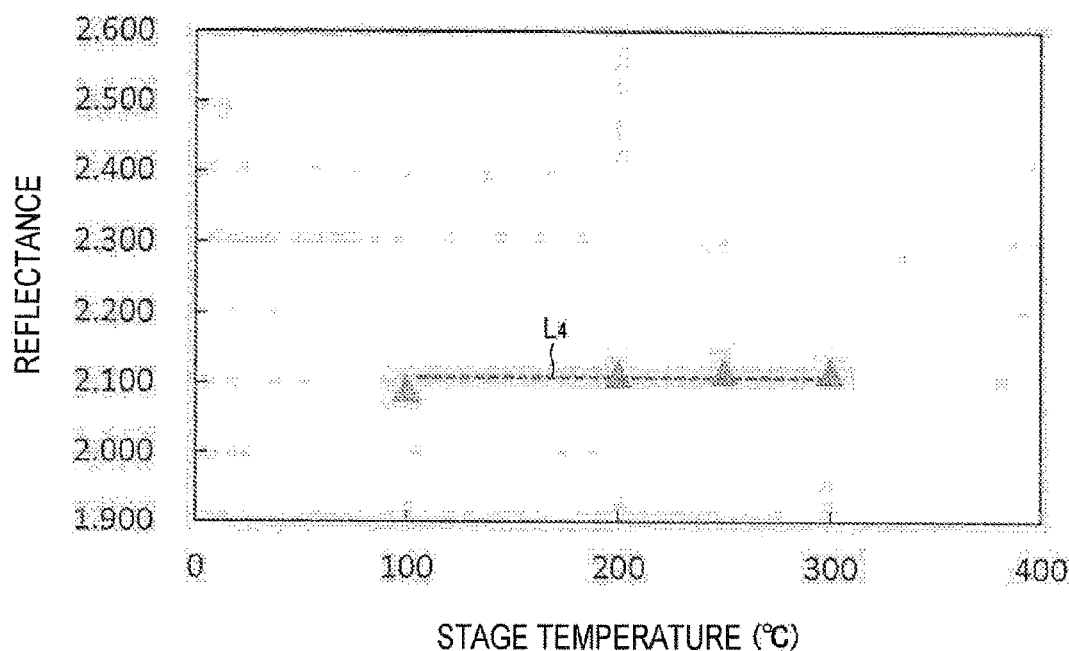
FIG. 18 is a graph illustrating a processing temperature dependence of the reflectance with respect to the SiN-containing insulating film in the additional test.

FIG. 18 illustrates the processing temperature dependence of the reflectance with respect to the SiN-containing insulating film. As illustrated, all plots are distributed along a substantially flat approximate line $L_4$ (having a slope of zero), and the reflectance hardly depends on the stage temperature (processing temperature). Further, the reflectance is determined by the dielectric constant. Therefore, it may be said that the dielectric constant also hardly depends on the stage temperature (processing temperature).

Figure 19A:
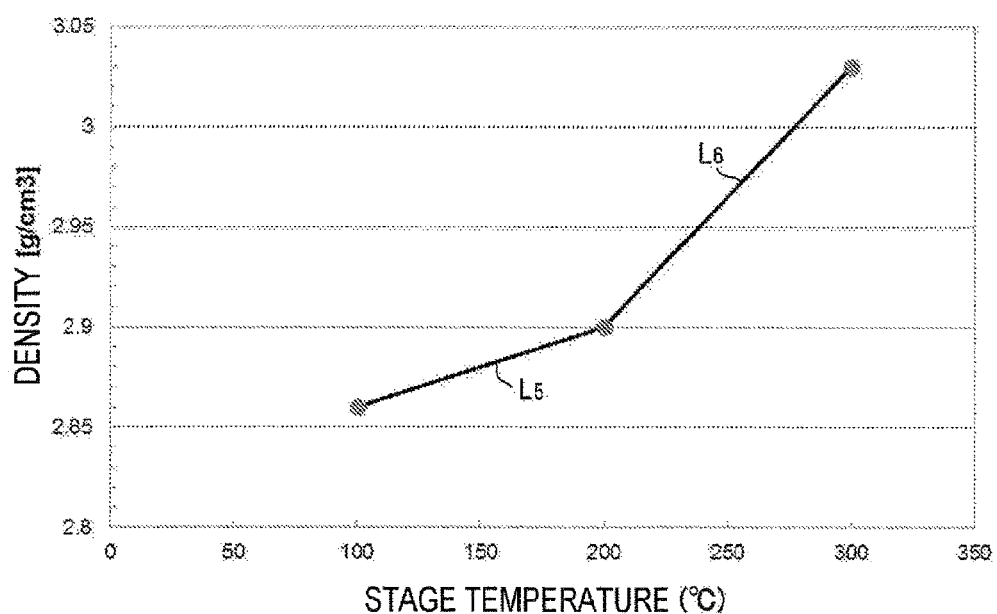
FIG. 19A is a graph illustrating a processing temperature dependence of the film density with respect to the SiN-containing insulating film in the additional test.
Figure 19B:
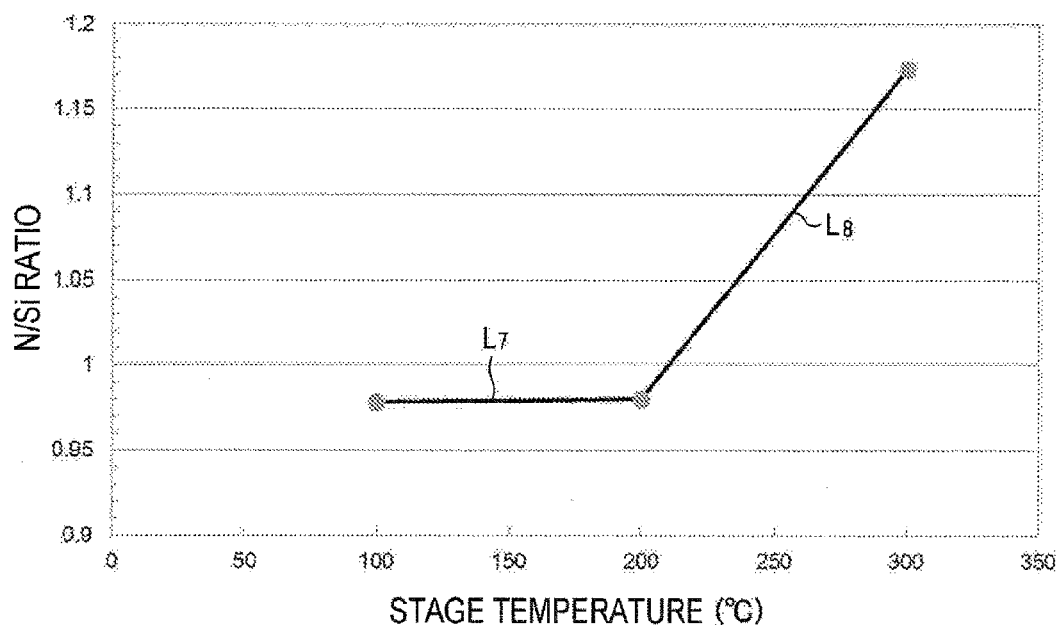
FIG. 19B is a graph illustrating a processing temperature dependence of the N/Si ratio with respect to the SiN-containing insulating film in the additional test.
Figure 19C:
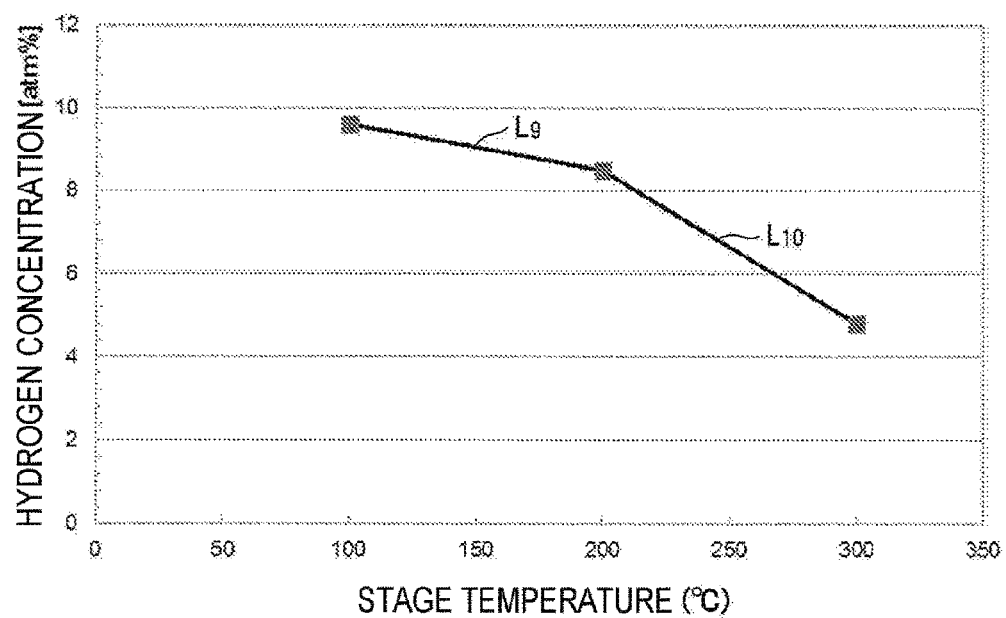
FIG. 19C is a graph illustrating a processing temperature dependence of the Si/H ratio with respect to the SiN-containing insulating film in the additional test.

FIGS. 19A, 19B, and 19C represent the processing temperature dependence of a film density, an N/Si ratio, and a hydrogen concentration of the SiN-containing insulating film, respectively. As illustrated, there is a rough tendency that, as the stage temperature (processing temperature) increases, the film density and the N/Si ratio increase, and the hydrogen concentration decreases. Here, the increase of the film density and the N/Si ratio means that the nitriding of the SiN-containing insulating film advances in the nitriding step. Further, the decrease of the hydrogen concentration means that hydrogen (H) in the SiN-containing insulating film is reduced in the nitriding step.

More precisely, as illustrated in FIG. 19A, as for the film density, a rate of increase in a temperature range of 200° C. to 300° C. (a slope of an approximate line $L_5$) is larger than a rate of increase in a temperature range of 100° C. to 200° C. (a slope of an approximate line $L_6$). Also as for the N/Si ratio, as illustrated in FIG. 19B, a rate of increase in a temperature range of 200° C. to 300° C. (a slope of an approximate line $L_8$) is larger than a rate of increase in a temperature range of 100° C. to 200° C. (a slope of an approximate line $L_7$). In addition, as illustrated in FIG. 19C, as for the hydrogen concentration, a rate of decrease in a temperature range of 200° C. to 300° C. (a slope of an approximate line $L_{10}$) is larger than a rate of decrease in a temperature range of 100° C. to 200° C. (a slope of an approximate line $L_9$).

As such, there is a rough tendency that, within the processing temperature range of 100° C. to 300° C., as the processing temperature increases, both the coverage characteristic and the electric insulation characteristic of the SiN-containing insulating film are enhanced. It is considered that the increase of the SiN film density and the decrease of the hydrogen concentration in the film are the main factors of the enhancement of the electric characteristics. Specifically, the coverage characteristic and the electric insulation characteristic of the SiN-containing insulating film are more remarkably enhanced within the processing temperature range of 200° C. to 300° C. In general, the processing temperature exceeding 300° C. is undesirable because the characteristics or functions of the respective layers (particularly, the magnetic layers 136, 140) constituting the MRAM element 130 (FIGS. 4A and 4B) may be deteriorated.

As described above, it has been found from the results of the additional test illustrated in FIGS. 16 to 19C that, according to the film formation method of the exemplary embodiment, a SiN-containing insulating film having generally good coverage characteristic and electric insulation characteristic is obtained in a wide processing temperature range of 100° C. to 300° C., and particularly, a SiN-containing insulating film having very good coverage characteristic and electric insulation characteristic is obtained in a processing temperature range of 200° C. to 300° C.

[Another Exemplary Embodiment or Modification]

Figure 20:
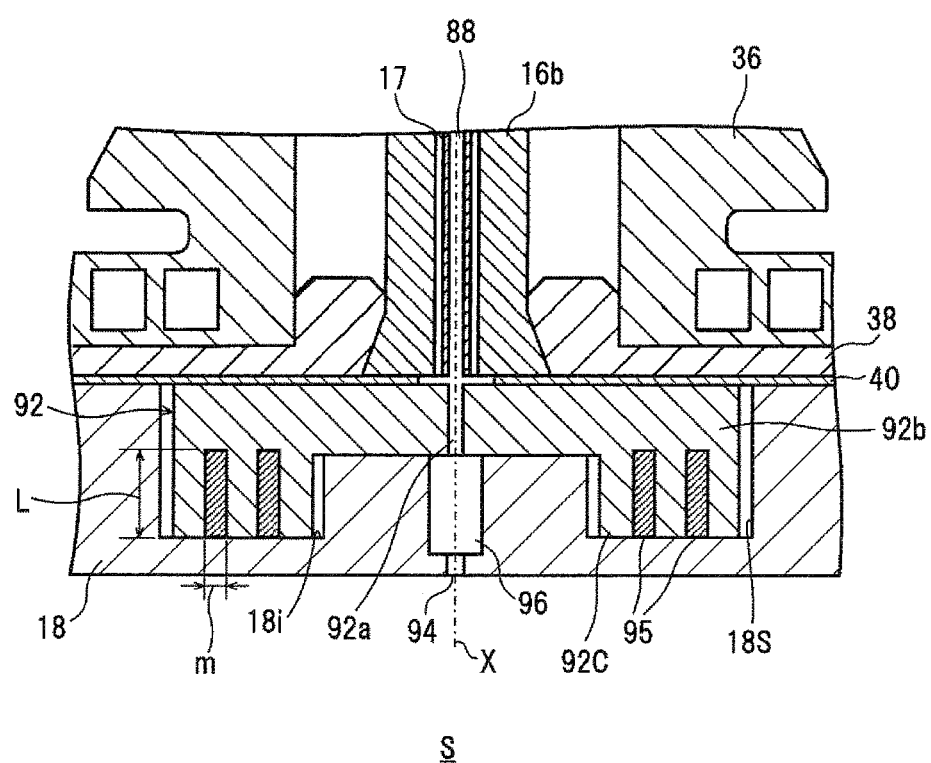
FIG. 20 is a partially enlarged cross-sectional view illustrating a configuration around the dielectric window gas flow path in a modification.

In the plasma processing apparatus of the exemplary embodiment, the configuration around the dielectric window gas flow path 96 may be changed as illustrated in FIG. 20 in order to suppress an abnormal discharge in the dielectric window gas flow path 96.

The connector 92 in the modification includes a main body 92b and a raised portion 92c. The main body 92b is formed with a through hole extending from the surface of the pipe member 17 side in the inner conductor 16b to the surface of the dielectric window gas flow path 96 side therein, that is, a gas flow path 92a. The raised portion 92c is raised from the main body 92b toward a groove 18i of the dielectric window 18. That is, as the raised portion 92c made of a dielectric is formed toward the groove 18i of the dielectric window 18 surrounding the dielectric window gas flow path 96, the raised portion 92c functions as an electric field shielding member that shields the microwaves propagated therethrough toward the dielectric window gas flow path 96.

A waveguide plate 95 is provided inside the connector 92. The waveguide plate 95 is made of a dielectric, and formed in a substantially cylindrical shape surrounding the central axis X. The waveguide plate 95 is made of, for example, alumina or quartz. The waveguide plate 95 is constituted by a dielectric that is the same as or different from the dielectric constituting the dielectric window 18. For example, the dielectric window 18 and the waveguide plate 95 may be made of alumina. Alternatively, the dielectric window 18 may be made of quartz and the waveguide plate 95 may be made of alumina.

The waveguide plate 95 is disposed inside the connector 92 to surround the dielectric window gas flow path 96 of the dielectric window 18. Specifically, the waveguide plate 95 is embedded in the raised portion 92c of the connector 92, so that the waveguide plate 95 is disposed inside the connector 92 to surround the dielectric window gas flow path 96 of the dielectric window 92. More specifically, the waveguide plate 95 is embedded in the raised portion 92c of the connector 92 in a state where one end face thereof is exposed to the groove 18i side of the dielectric window 18, so that the waveguide plate 95 is disposed inside the connector 92 to surround the dielectric window gas flow path 96 of the dielectric window 92. The one end face of the waveguide plate 95 exposed to the groove 18i may be disposed in contact with the dielectric window 18.

The waveguide plate 95 guides the microwaves propagated inside the dielectric window 18 toward the dielectric window gas flow path 96, from the one end face exposed to the groove 18i of the dielectric window 18 to the other end face of the inner side of the connector 92. When the microwaves are guided to the inner side of the connector 92 by the waveguide plate 95, standing waves of the microwaves are generated inside the connector 92, so that the microwaves are offset with each other. In other words, since the microwaves are guided to the inner side of the connector 92 by the waveguide plate 95, it becomes difficult for the microwave to reach the dielectric window gas flow path 96.

Assuming that the wavelength of the microwaves propagated inside the waveguide plate 95 is $\lambda$, the height L of the waveguide plate 95 is $\lambda/4$. The height L of the waveguide plate 95 is a distance from one end face of the waveguide plate 95 exposed to the groove 18i side of the dielectric window 18 from the other end face of the waveguide 95 embedded in the raised portion 92c of the connector 92. That is, when the height L of the waveguide plate 95 is set to $\lambda/4$, the standing wave generation rate of the microwaves guided to the inner side of the connector 92 by the waveguide plate 95 is enhanced. Thus, the microwaves are offset with each other.

In addition, assuming that the wavelength of the microwaves propagated inside the waveguide plate 95 is $\lambda$, a thickness m of the waveguide plate 95 is $\lambda/8$ to $\lambda/4$. That is, when the thickness m of the waveguide plate 95 is set to $\lambda/8$ to $\lambda/4$, it becomes easy for the microwaves to be guided to the inner side of the connector 92 through the waveguide plate 95.

One or more waveguide plates 95 are disposed inside the connector 92 along the direction away from the dielectric window gas flow path 96. More specifically, one or more waveguide plates 95 are disposed inside the disc-shaped connector 92 along the radial direction of the connector 92. In the illustrated configuration example, two waveguide plates 95 are disposed inside the connector 92 along the radial direction of the disc-shaped connector 92. Each waveguide plate 95 guides the microwaves propagated inside the dielectric window 18 toward the inside of the connector 92 in the radial direction, to the inner side of the connector 92. Thus, the microwaves propagated inside the dielectric window 18 toward the inside of the connector 92 in the radial direction hardly reach the dielectric window gas flow path 96.

As such, in the modification, since the electrical field strength in the dielectric window gas flow path 96 may be reduced, a burden on the method for controlling the pressure in the dielectric window gas flow path 96 at a high level is thus reduced. Accordingly, it is possible to select the pressure set vale $P_S$ in the dielectric window gas flow path 96 as a very low value (e.g., 10 Torr or less). In that case, the times $t_{S2}$, $t_{S5}$ required for the first and second preliminary gas introduction steps $S_2$, $S_5$ and the time $t_{S4}$, $t_{S7}$ required for the first and second purging steps $S_4$, $S_7$ in the SiN film formation cycle of the above exemplary embodiment may be more remarkably reduced.

Further, as can be understood from the exemplary embodiment as described above, for example, in the SiN film formation cycle of the above exemplary embodiment, even though purging is performed using the bypass exhaust path 116 or the external exhaust line in any one of at least the first and second purging steps $S_4$, $S_7$, a certain time shortening effect may be obtained.

Further, even in the gas introduction mechanisms for introducing the processing gases provided from the processing gas supply unit 80 into the chamber 12, various modifications are possible. For example, the sidewall gas lines including a gas flow path and a gas injection port in the sidewall 12a of the chamber 12 may be reduced to one system, or, on the contrary, increased to three or more systems. The processing gases introduced from the ceiling gas line and the processing gases introduced from the sidewall gas line may be partially or entirely different from each other in kind.

The plasma processing apparatus of the above exemplary embodiment (FIG. 1) includes a high frequency power source 58 for RF bias. However, an apparatus configuration in which the high frequency power source 58, the matching unit 60, and the feeding rod 62 are omitted is also possible.

The plasma processing apparatus of the present disclosure is not limited to the plasma CVD, but may also be applicable to other plasma processes such as, for example, etching or plasma ALD. In addition, the present disclosure is not limited to the plasma processing apparatus, but may also be applicable to an inductively coupled plasma processing apparatus using high frequency waves as microwaves for plasma generation.

DESCRIPTION OF SYMBOL

10: plasma processing apparatus
12: chamber (processing container)
14: microwave supply unit
15: antenna
18: dielectric window
20: stage
20a: susceptor
56: exhaust device 80: processing gas supply unit
82: ceiling gas line (first gas introduction unit)
84: lower sidewall gas line (second gas introduction unit)
86: upper sidewall gas line (third gas introduction unit)
90: first gas supply unit
94: ceiling gas injection port
96: dielectric window gas flow path
116: bypass exhaust line
118: electromagnetic valve (opening/closing valve)
122: controller

What is claimed is:

1. A plasma processing apparatus that alternately repeatedly performs a first plasma processing step using first and second processing gases and a second plasma processing step using third and fourth processing gases, the apparatus comprising:
   a processing container provided with a dielectric window in a ceiling and configured to removably accommodate a workpiece;
   an exhaust unit configured to evacuate the processing container;
   a processing gas supply unit configured to supply the first, second, third, and fourth processing gases into the processing container;
   a first gas introduction unit that includes a top plate gas injection port provided in the dielectric window to face a plasma generating space in the processing container, a dielectric window gas flow path that penetrates through the dielectric window from an outside and arrives at the top plate gas injection port, and a first external gas flow path that defines a gas flow path from the processing gas supply unit to the dielectric window gas flow path;
   a second gas introduction unit that includes a sidewall gas injection port provided in a sidewall of the processing container to face the plasma generating space in the processing container, a sidewall gas flow path that extends circumferentially inside the sidewall of the processing container and communicates with the sidewall gas injection port, and a second external gas flow path that defines a gas flow path from the processing gas supply unit to the sidewall gas flow path;
   an electromagnetic wave supply unit configured to supply electromagnetic waves for plasma generation into the plasma generating space in the processing container through the dielectric window;
   a bypass exhaust path connecting the first external gas flow path and the exhaust unit; and
   an opening/closing valve provided in the bypass exhaust path,
   wherein in the first plasma processing step, the first and second processing gases are introduced from the processing gas supply unit into the processing container through the first and second gas introduction units, respectively, and the electromagnetic waves for plasma generation are introduced from the electromagnetic wave supply unit into the processing container,
   in the second plasma processing step, the third and fourth processing gases are introduced from the processing gas supply unit into the processing container through the first and second gas introduction units, respectively, and the electromagnetic waves for plasma generation are introduced from the electromagnetic wave supply unit into the processing container, and
   after the first or second plasma processing step is completed, the opening/closing valve is opened to discharge a gas remaining in the dielectric window gas flow path of the first gas introduction unit to the exhaust unit side via the bypass exhaust path.

2. The plasma processing apparatus of claim 1, wherein the processing gas supply unit includes a flow rate controller configured to control a flow rate of the first or third processing gas, and is configured to control, over a predetermined time before the first or second plasma processing step is started, the flow rate of the first or third processing gas to be introduced from the processing gas supply unit into the processing container through the first gas introduction unit to a pre-flow rate set value higher than a regular flow rate set value for the first or second plasma processing step.

3. The plasma processing apparatus of claim 2, wherein the pre-flow rate set value is twice to three times the regular flow rate set value.

4. The plasma processing apparatus of claim 1, wherein each of the first and second processing gases is a mixed gas containing the same kinds of gases in independent composition rate and flow rate.

5. The plasma processing apparatus of claim 1, wherein each of the third and fourth processing gases is a mixed gas containing the same kinds of gases in independent composition rate and flow rate.

6. The plasma processing apparatus of claim 1, wherein the top plate gas injection port is provided in a central portion of the dielectric window.

7. A method for forming an insulating film on a workpiece using a plasma processing apparatus including:
   a processing container provided with a dielectric window in a ceiling and configured to removably accommodate the workpiece;
   an exhaust unit configured to evacuate the processing container;
   a processing gas supply unit configured to supply first, second, third, and fourth processing gases into the processing container;
   a first gas introduction unit that includes a top plate gas injection port provided in the dielectric window to face a plasma generating space in the processing container, a dielectric window gas flow path that penetrates through the dielectric window from an outside and arrives at the top plate gas injection port, and a first external gas flow path that defines a gas flow path from the processing gas supply unit to the dielectric window gas flow path;
   a second gas introduction unit that includes a sidewall gas injection port provided in a sidewall of the processing container to face the plasma generating space in the processing container, a sidewall gas flow path that extends circumferentially inside the sidewall of the processing container and communicates with the sidewall gas injection port, and a second external gas flow path that defines a gas flow path from the processing gas supply unit to the sidewall gas flow path;
   an electromagnetic wave supply unit configured to supply electromagnetic waves for plasma generation into the plasma generating space in the processing container through the dielectric window;
   a bypass exhaust path connecting the first external gas flow path and the exhaust unit; and
   an opening/closing valve provided in the bypass exhaust path,
   the method comprising:
   a first step of forming a SiN-containing insulating film containing SiN on the workpiece under plasma of the first and second processing gases generated in the processing container by decompressing the processing container by the exhaust unit while introducing the first and second processing gases each containing trisilylamine (TSA), $N_2$ gas, Ar gas, and $H_2$ gas from the processing gas supply unit into the processing container through the first and second gas introduction unit, respectively, and introducing the electromagnetic waves for plasma generation from the electromagnetic wave supply unit;

a second step of nitriding the SiN-containing insulating film on the workpiece under plasma of the third and fourth processing gases generated in the processing container by decompressing the processing container by the exhaust unit while introducing the first and second processing gases each containing $N_2$ gas, Ar gas, and $H_2$ gas from the processing gas supply unit into the processing container through the first and second gas introduction unit, respectively, and introducing the electromagnetic waves for plasma generation from the electromagnetic wave supply unit; and a third step of discharging a gas remaining in the dielectric window gas flow path of the first gas introduction unit to the exhaust unit side via the bypass exhaust path by opening the opening/closing valve after the first or second plasma processing step is completed, wherein the first step and the second step are alternately repeated with the third step performed therebetween.

8. The method of claim 7, wherein the flow rate of the first or third processing gas to be introduced from the processing gas supply unit into the processing container through the first gas introduction unit is controlled to a pre-flow rate set value higher than a regular flow rate set value for the step, over a predetermined time before the first or second step is started.

9. The method of claim 8, wherein the pre-flow rate set value is twice to three times the regular flow rate set value.

10. The method of claim 7, wherein a processing temperature of the workpiece is 100° C. to 300° C. in the first step.

11. The method of claim 7, wherein the processing temperature of the workpiece is 200° C. to 300° C. in the first step.

* * * * *